(12) United States Patent
Frey et al.

(10) Patent No.: US 11,566,033 B2
(45) Date of Patent: Jan. 31, 2023

(54) COMPOUND AND AN ORGANIC SEMICONDUCTING LAYER COMPRISING THE SAME

(71) Applicant: Novaled GmbH, Dresden (DE)

(72) Inventors: Julien Frey, Dresden (DE); Regina Luschtinetz, Dresden (DE)

(73) Assignee: Novaled GmbH, Dresden (DE)

( * ) Notice: Subject to any disclaimer, the term of this patent is extended or adjusted under 35 U.S.C. 154(b) by 267 days.

(21) Appl. No.: 16/955,820

(22) PCT Filed: Dec. 18, 2018

(86) PCT No.: PCT/EP2018/085534
§ 371 (c)(1),
(2) Date: Jun. 19, 2020

(87) PCT Pub. No.: WO2019/121708
PCT Pub. Date: Jun. 27, 2019

(65) Prior Publication Data
US 2020/0339614 A1    Oct. 29, 2020

(30) Foreign Application Priority Data
Dec. 20, 2017  (EP) .................... 17209012

(51) Int. Cl.
*C07F 9/53*  (2006.01)
*H01L 51/00*  (2006.01)
*H01L 51/50*  (2006.01)

(52) U.S. Cl.
CPC ........ *C07F 9/5325* (2013.01); *H01L 51/0054* (2013.01); *H01L 51/5076* (2013.01)

(58) Field of Classification Search
CPC . C07F 9/5325; H01L 51/0054; H01L 51/5076
(Continued)

(56) References Cited

U.S. PATENT DOCUMENTS

| 7,776,455 B2 * | 8/2010 | Gerhard .................. C09B 57/00 428/917 |
| 8,329,898 B2 | 12/2012 | Salbeck et al. |

(Continued)

FOREIGN PATENT DOCUMENTS

| CN | 103087103 A | 5/2013 |
| CN | 103187531 A | 7/2013 |

(Continued)

OTHER PUBLICATIONS

PCT International Search Report and Written Opinion for PCT Application No. PCT/EP2018/085534 dated Apr. 17, 2019 (9 pages).
(Continued)

*Primary Examiner* — Vu A Vu
(74) *Attorney, Agent, or Firm* — Eversheds Sutherland (US) LLP

(57) ABSTRACT

The present invention relates to the compound represented by the general Formula (I):
wherein
X is selected from the group consisting of O, S and Se;
$R^1$ and $R^2$ are independently selected from the group consisting of $C_1$ to $C_{12}$ alkyl, $C_6$ to $C_{20}$ aryl and $C_5$ to $C_{20}$ heteroaryl, wherein the respective $C_1$ to $C_{12}$ alkyl may optionally be substituted with $C_6$-$C_{20}$ aryl;
L represents a single bond or is selected from the group consisting of $C_6$ to $C_{18}$ arylene or $C_2$ to $C_{20}$ heteroarylene;
wherein the rings B, C and D may each be unsubstituted or substituted and B and C are anellated aromatic 6-membered rings;
$R^3$ and $R^4$ are independently selected from the group consisting of unsubstituted or substituted $C_1$ to $C_{12}$ alkyl, unsubstituted or substituted $C_1$ to $C_{12}$ fluorinated alkyl, unsubstituted or substituted $C_6$ to $C_{20}$ aryl and unsubstituted or substituted $C_5$ to $C_{20}$ heteroaryl;
(Continued)

wherein the substituents, if present in B, C, D, $R^3$ and $R^4$, are independently selected from the group consisting of $C_1$-$C_{20}$ linear alkyl, $C_3$-$C_{20}$ branched alkyl, $C_3$-$C_{20}$ cyclic alkyl, $C_1$-$C_{20}$ linear alkoxy, $C_3$-$C_{20}$ branched alkoxy, linear fluorinated $C_1$-$C_{12}$ alkyl, linear fluorinated $C_1$-$C_{12}$ alkoxy, $C_3$-$C_{12}$ branched fluorinated cyclic alkyl, $C_3$-$C_{12}$ fluorinated cyclic alkyl, $C_3$-$C_{12}$ fluorinated cyclic alkoxy, CN, $C_6$-$C_{20}$ aryl, $C_2$-$C_{20}$ heteroaryl, OR, SR, (C=O)R, (C=O)NR2, $SiR_3$, (S=O)R, (S=O)$_2$R, CR=$CR_2$, Fluorine, $NR_2$, $NO_2$;

wherein R is independently selected from $C_1$-$C_{20}$ linear alkyl, $C_1$-$C_{20}$ alkoxy, $C_1$-$C_{20}$ thioalkyl, $C_3$-$C_{20}$ branched alkyl, $C_3$-$C_{20}$ cyclic alkyl, $C_3$-$C_{20}$ branched alkoxy, $C_3$-$C_{20}$ cyclic alkoxy, $C_3$-$C_{20}$ branched thioalkyl, $C_3$-$C_{20}$ cyclic thioalkyl, $C_6$-$C_{20}$ aryl and $C_3$-$C_{20}$ heteroaryl; and $R^3$ and $R^4$ may or may not be connected with each other via a single bond, an organic semiconducting layer comprising the same, an organic electronic device comprising the organic semiconducting layer and a display device or a lighting device comprising the same.

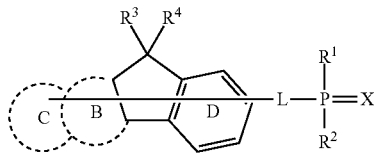

14 Claims, 2 Drawing Sheets

(58) Field of Classification Search
USPC .................................................. 257/40
See application file for complete search history.

(56) References Cited

U.S. PATENT DOCUMENTS

| 8,975,385 | B2* | 3/2015 | Hasegawa ........... C07F 9/65515 534/15 |
| 9,722,183 | B2 | 8/2017 | Fadhel et al. |
| 9,859,503 | B2 | 1/2018 | Hwang et al. |
| 9,947,879 | B2 | 4/2018 | Ito et al. |
| 2008/0265216 | A1 | 10/2008 | Hartmann et al. |
| 2014/0332789 | A1 | 11/2014 | Dorak et al. |
| 2016/0181542 | A1 | 6/2016 | Kawamura et al. |
| 2016/0322568 | A1 | 11/2016 | Fadhel et al. |
| 2017/0309830 | A1 | 10/2017 | Kim et al. |

FOREIGN PATENT DOCUMENTS

| KR | 20150027720 A | 3/2015 |
| WO | 2014/073306 | 5/2014 |
| WO | 2015/115744 | 8/2015 |
| WO | 2017089399 A1 | 6/2017 |

OTHER PUBLICATIONS

Notification of First Office Action issued in China application No. 201880086886.2, dated Oct. 31, 2022, 17 pages.

* cited by examiner

COMPOUND AND AN ORGANIC SEMICONDUCTING LAYER COMPRISING THE SAME

CROSS REFERENCE TO RELATED APPLICATIONS

This application is a U.S. national phase application of PCT/EP2018/085534, filed Dec. 18, 2018, which claims priority to European Application No. 17209012.8, filed Dec. 20, 2017. The content of these applications is incorporated herein by reference.

The present invention relates to a compound, an organic semiconducting layer comprising the same, an organic electronic device comprising the organic semiconducting layer, and a display device or a lighting device comprising the organic electronic device.

BACKGROUND ART

Organic light-emitting diodes (OLEDs, which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

A variety phosphine oxide electron transport material is known in the art. However, there is still a need to further improve the performance of organic electronic devices comprising such phosphine-oxide electron transport materials, in particular to improve lifetime curing deficiency and driving voltage thereof.

It is, therefore, an object of the present invention to provide novel compounds for use in the layers of organic electronic devices overcoming drawbacks of the prior art, in particular compounds which are suitable to improve the performance of the organic electronic devices. In particular, it is the object of the present invention to improve performance of organic electronic devices, in particular lifetime, driving voltage and current efficiencies of OLED devices and the glass transition temperatures of compounds for use therein. Furthermore, it is an object of the present invention to provide compounds suitable to reduce the driving voltage of an organic electronic device comprising the same.

DESCRIPTION OF THE INVENTION

The above object is achieved by a compound represented by the general Formula (I):

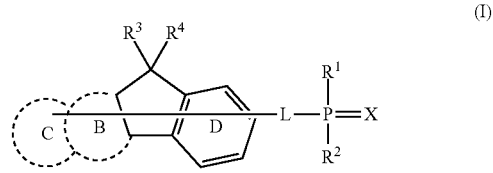

(I)

wherein
X is selected from the group consisting of O, S and Se;
$R^1$ and $R^2$ are independently selected from the group consisting of $C_1$ to $C_{12}$ alkyl, $C_6$ to $C_{20}$ aryl and $C_5$ to $C_{20}$ heteroaryl, wherein the respective $C_1$ to $C_{12}$ alkyl may optionally be substituted with $C_6$-$C_{20}$ aryl;
L represents a single bond or is selected from the group consisting of $C_6$ to $C_{18}$ arylene or $C_2$ to $C_{20}$ heteroarylene;
wherein the rings B, C and D may each be unsubstituted or substituted and B and C are anellated aromatic rings;
$R^3$ and $R^4$ are independently selected from the group consisting of unsubstituted or substituted $C_1$ to $C_{12}$ alkyl, unsubstituted or substituted $C_1$ to $C_{12}$ fluorinated alkyl, unsubstituted or substituted $C_6$ to $C_{20}$ aryl and unsubstituted or substituted $C_5$ to $C_{20}$ heteroaryl;
wherein the substituents, if present in B, C, D, $R^3$ and $R^4$, are independently selected from the group consisting of $C_1$-$C_{20}$ linear alkyl, $C_3$-$C_{20}$ branched alkyl, $C_3$-$C_{20}$ cyclic alkyl, $C_1$-$C_{20}$ linear alkoxy, $C_3$-$C_{20}$ branched alkoxy, linear fluorinated $C_1$-$C_{12}$ alkyl, linear fluorinated $C_1$-$C_{12}$ alkoxy, $C_3$-$C_{12}$ branched fluorinated cyclic alkyl, $C_3$-$C_{12}$ fluorinated cyclic alkyl, $C_3$-$C_{12}$ fluorinated cyclic alkoxy, CN, $C_6$-$C_{20}$ aryl, $C_2$-$C_{20}$ heteroaryl, OR, SR, (C=O)R, (C=O)NR2, $SiR_3$, (S=O)R, (S=O)$_2$R, CR=$CR_2$, Fluorine, $NR_2$, $NO_2$;
wherein R is independently selected from $C_1$-$C_{20}$ linear alkyl, $C_1$-$C_{20}$ alkoxy, $C_1$-$C_{20}$ thioalkyl, $C_3$-$C_{20}$ branched alkyl, $C_3$-$C_{20}$ cyclic alkyl, $C_3$-$C_{20}$ branched alkoxy, $C_3$-$C_{20}$ cyclic alkoxy, $C_3$-$C_{20}$ branched thioalkyl, $C_3$-$C_{20}$ cyclic thioalkyl, $C_6$-$C_{20}$ aryl and $C_3$-$C_{20}$ heteroaryl; and
$R^3$ and $R^4$ may or may not be connected with each other via a single bond.

Surprisingly, it has been found that a compound having the Formula (I), i.e. comprising combination of a phosphine oxide moiety and the structural moiety bound to group L, is helpful to increase the glass transition temperature by several 10K. Furthermore, it was surprisingly found by the inventors that the use of such compounds as electron transporting host in OLEDs in combination with additive, such as a metal, a metal salt or a me complex, results in improved device performance, in particular with respect to lifetime and cd/A efficiency.

In the above general Chemical Formula (I) the L moiety is bonded to one carbon atom of one of the aromatic rings B, C or D which may be 6-membered aromatic rings (=phenyl).

In other words, the connection between L and the moiety can be via one of the rings B, C or D but not via one of the groups $R^3$ or $R^4$. For binding, one of the hydrogen atoms comprised in the rings B, C and D is replaced by the single bond to the L-moiety.

The aromatic rings B and C are anellated aromatic rings. That is, moieties of the following Formulas may be present in the general Chemical Formula (I) above.

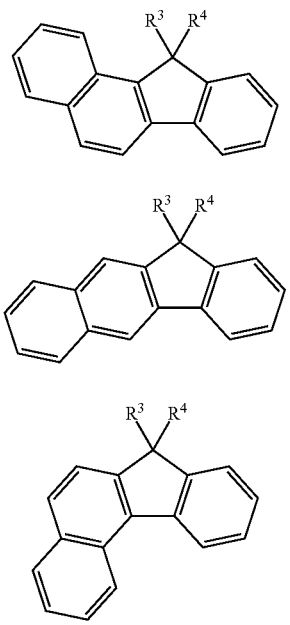

(IIa)

(IIb)

(IIc)

In the above three Formulas (IIa to IIc), the ring C is the outermost ring on the left side and ring D is the outermost ring on the right side.

The term anellated in the regard refers to a system of aromatic rings which are condensed to each other. Two aromatic rings are considered to be condensed to each other in terms of the present disclosure if the two aromatic rings share with each other two carbon atoms.

The term "condensed rings" describes a molecular structure in which two or more aromatic rings have two carbon atoms in common. For example, a napthyl group, an anthracene group etc. comprise condensed rings and are considered as condensed ring systems or, in other words, a system of aromatic rings which are condensed to each other.

In an embodiment L is linked to Formulas IIIa, IIIb and IIIc at one of the positions marked with an asterisk (*).

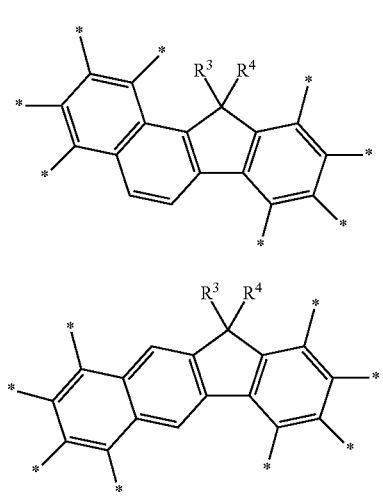

(IIIa)

(IIIb)

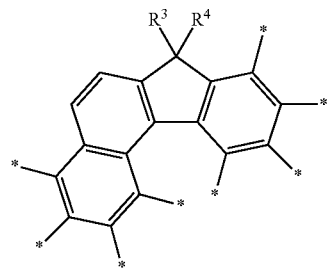

(IIIc)

In the inventive compound X may be O. In this way, improved stability of the inventive compound can be achieved and improved usability of the inventive compounds in organic semiconducting layers of organic electronic devices was observed.

$R^1$ and $R^2$ may independently be selected from the group of consisting $C_1$ to $C_{12}$ alkyl or $R^1$ and $R^2$ may be independently selected from the group consisting of $C_6$ to $C_{12}$ aryl. In this way, advantageous fine tuning of the electronic structure of the compound with respect to the usability thereof in organic electronic devices is achieved.

In the inventive compound L may represent a single bond or L may comprise at least one of a bivalent structure moiety which is selected from the group consisting of phenylene, biphenylene, dibenzofuranylene, anthracenylene, quinolinylene, terphenylenylene, dibenzosilolylene, fluorenylene and naphtylene. Respective choices allow fine tuning of the electronic structure of the inventive compound to improve the usability of the inventive compounds in organic semiconducting layers of organic electronic devices.

In the inventive compound, $R^3$ and $R^4$ may be independently selected from $C_6$ to $C_{20}$ aryl. Respective choices allow fine tuning of the electronic structure of the inventive compound to improve the usability thereof in organic semiconducting layers of organic electronic devices.

In the inventive compound, Formula (I) may comprise one of a spiro[benzo[a]fluorene-11,9' fluorene], spiro[benzo[b]fluorene-11,9' fluorene], or spiro[benzo[c]fluorene-7,9'-fluorene] moiety. In this regard, it might be provided that the "spiro-moieties" referred to above are comprised in the moiety comprising the rings B, C and D and the substituents $R^3$ and $R^4$. Respective choices allow fine tuning of the electronic structure of the inventive compound to improve the usability of the inventive compounds in organic semiconducting layers of organic electronic devices.

Particularly preferred compounds in accordance with the invention and the requirements of Formula (I) above are the following compounds A-1 to A-47.

A-1
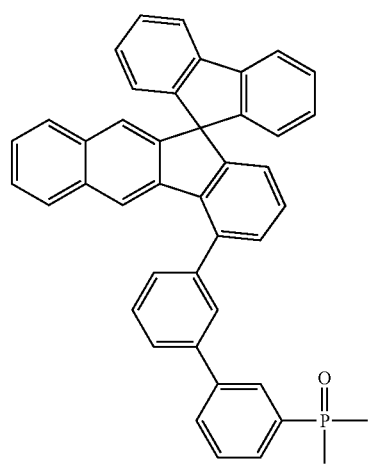
A-2
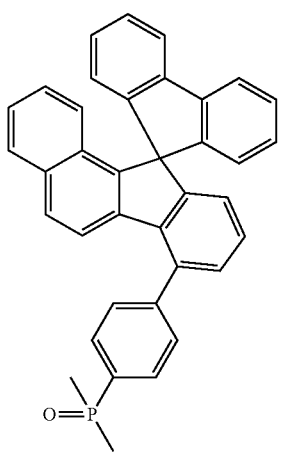
A-3
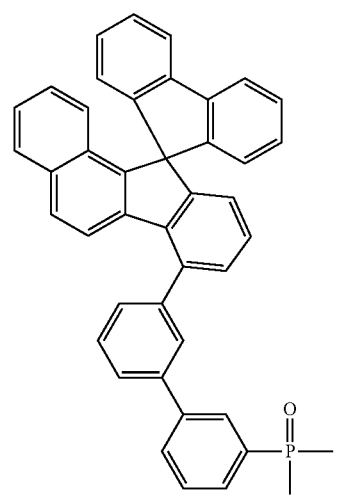
A-4
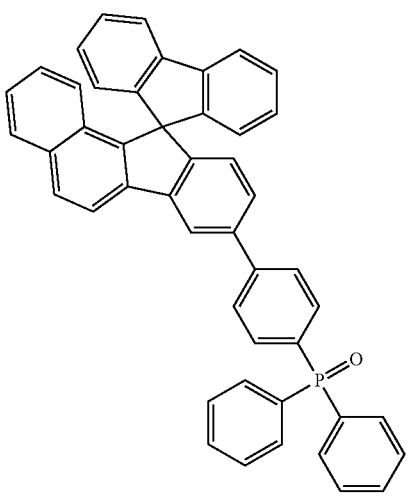
A-5
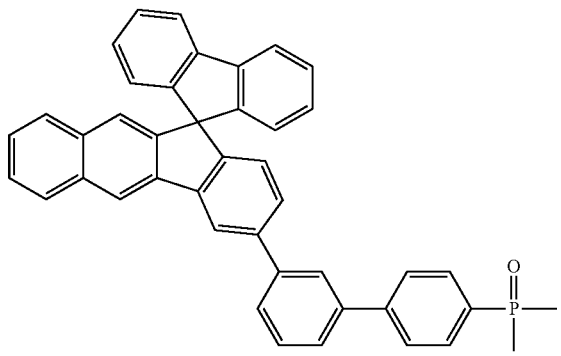
A-6
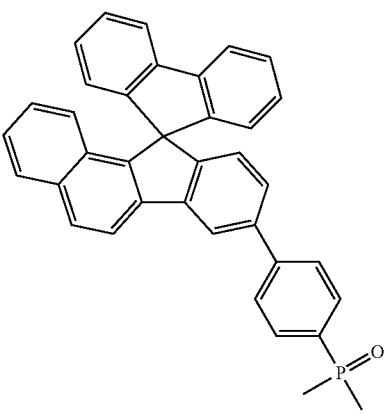

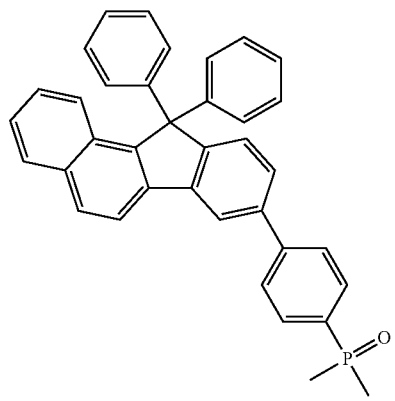
A-7
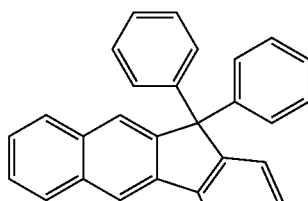
A-10
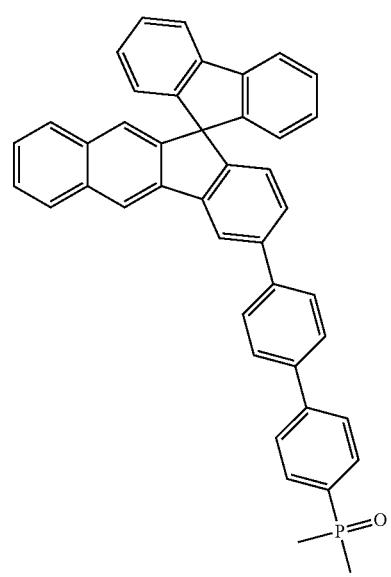
A-8
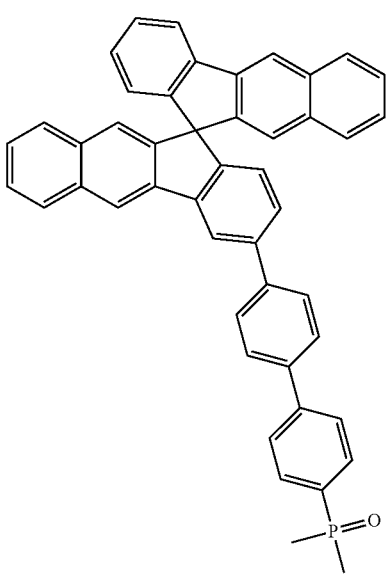
A-11
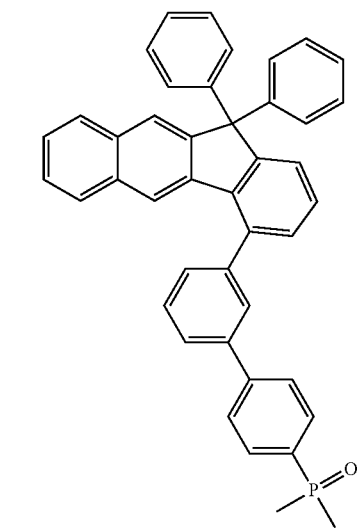
A-9
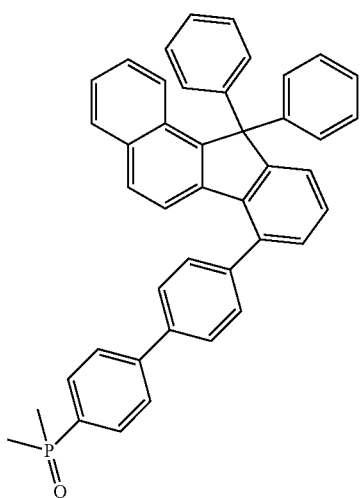
A-12

A-13
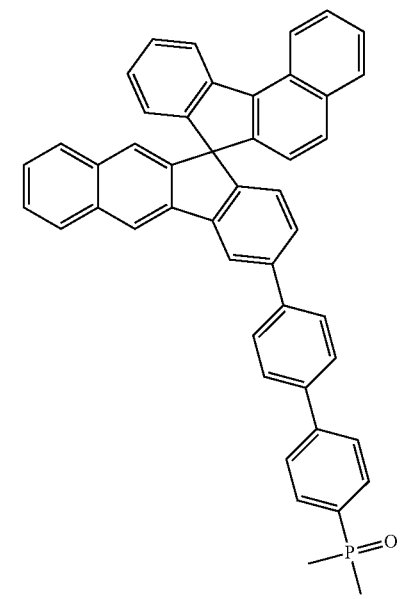
A-16
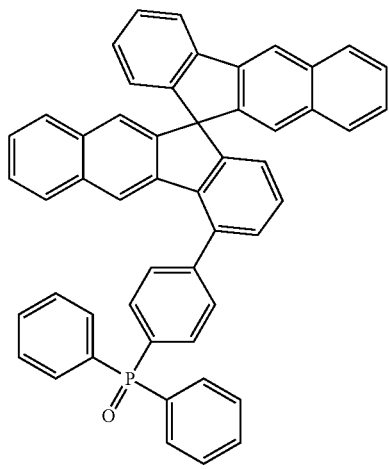
A-14
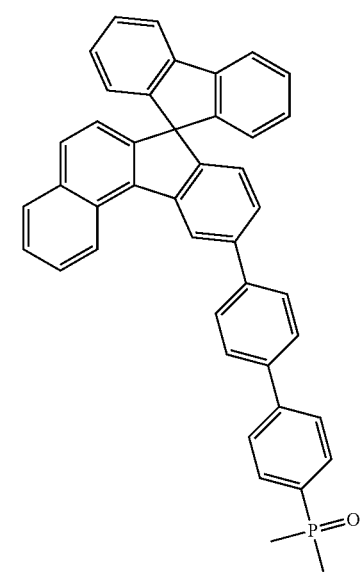
A-17
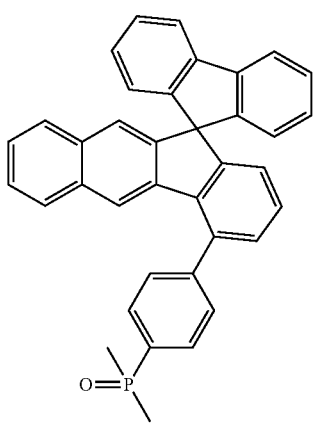
A-15
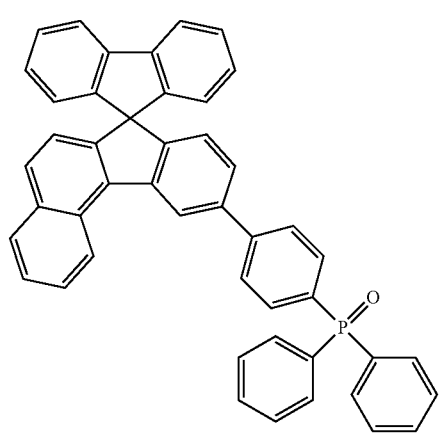
A-18
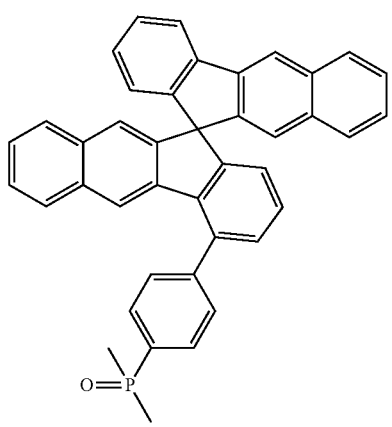

A-19
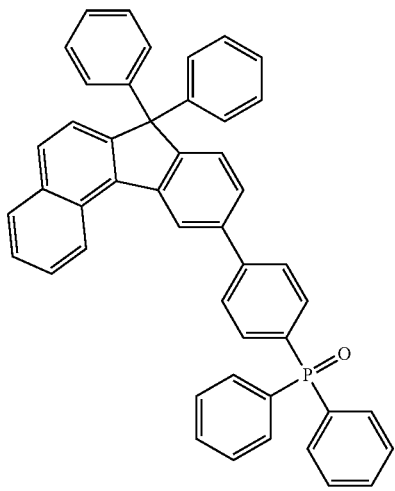
A-20
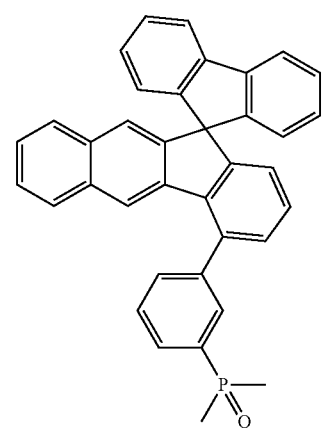
A-21
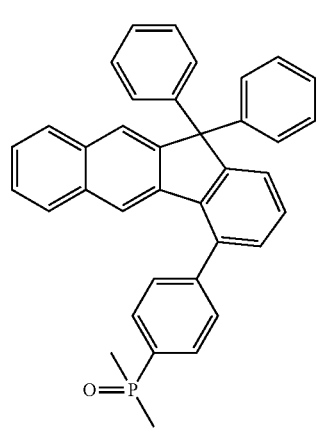
A-22
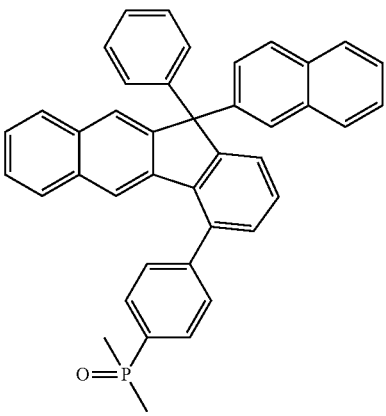
A-23
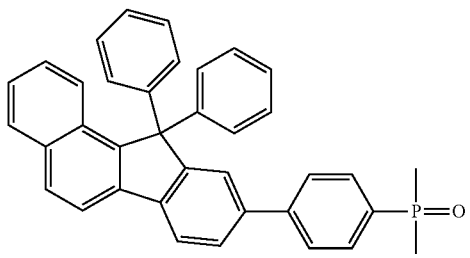
A-24
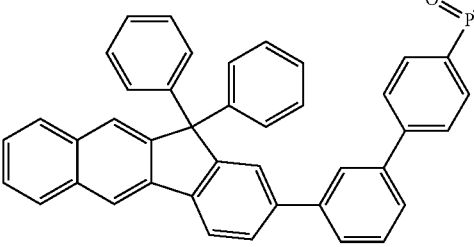
A-25
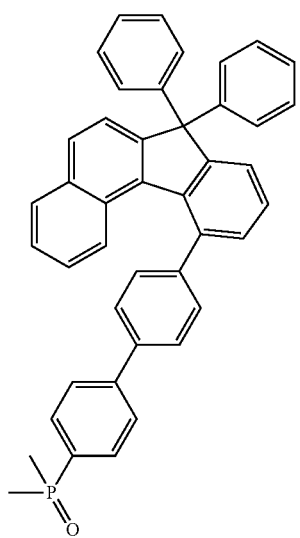

A-26
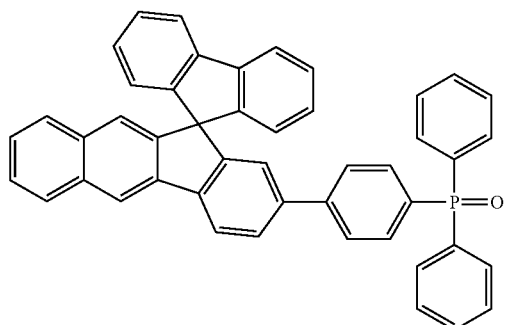
A-27
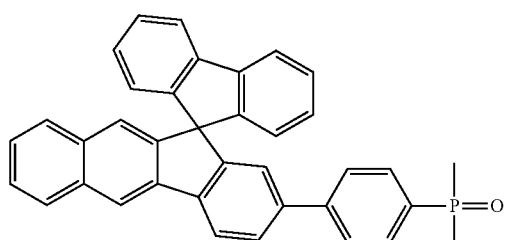
A-28
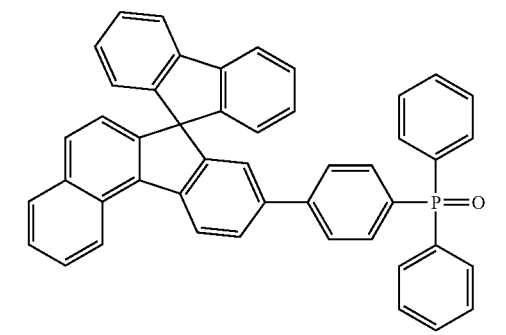
A-29
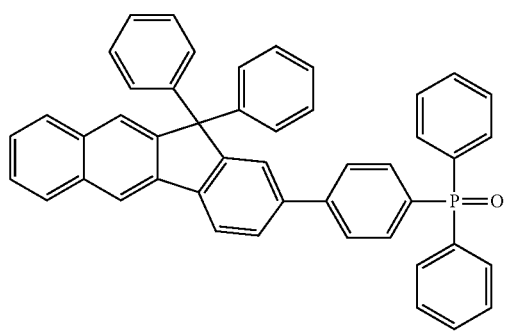
A-30
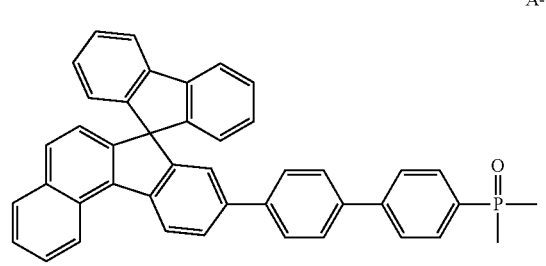
A-31
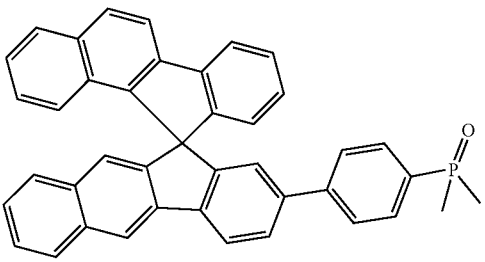
A-32
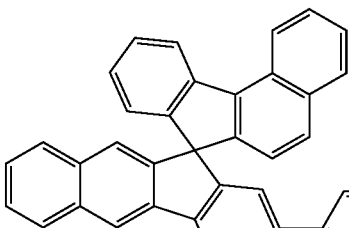
A-33
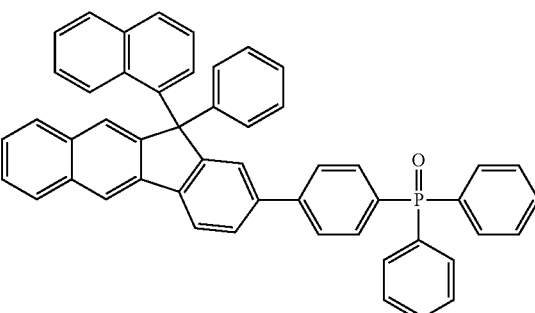
A-34
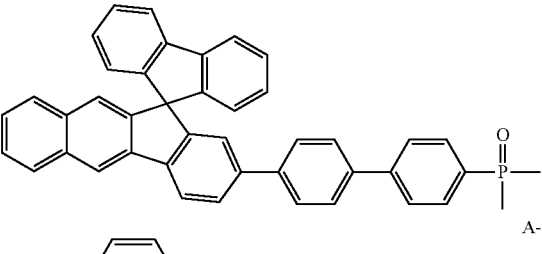
A-35
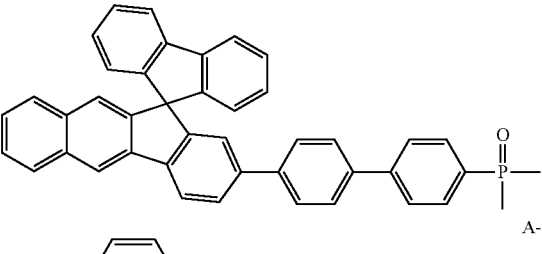
A-36
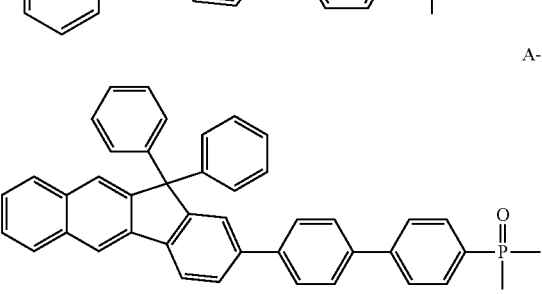

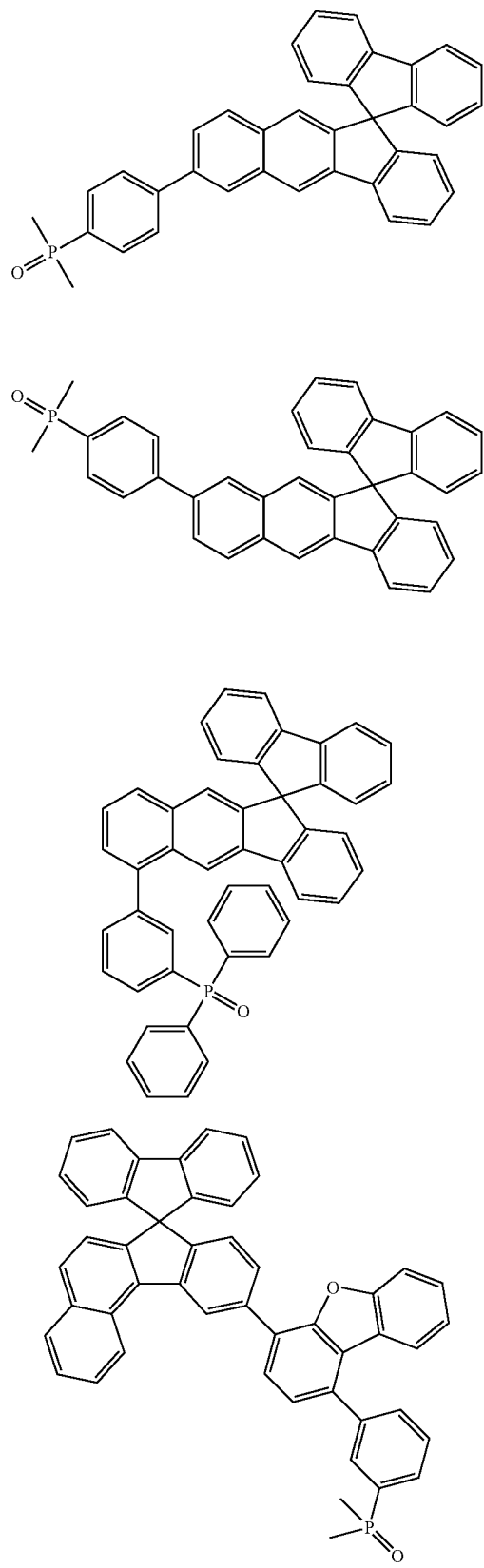
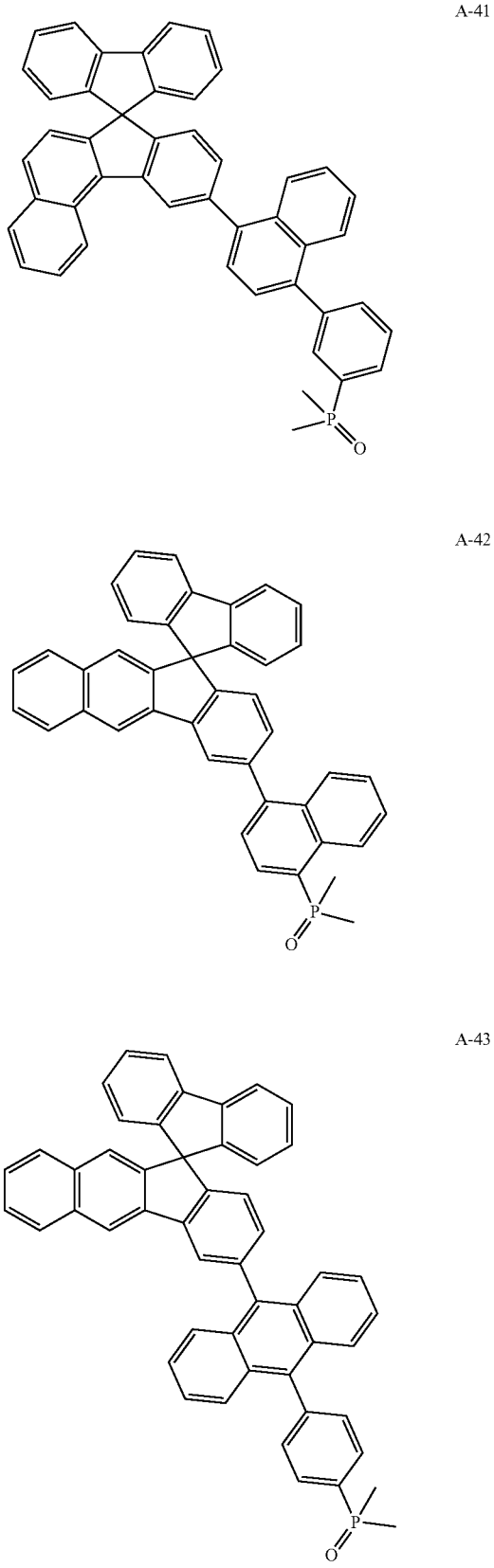

A-44

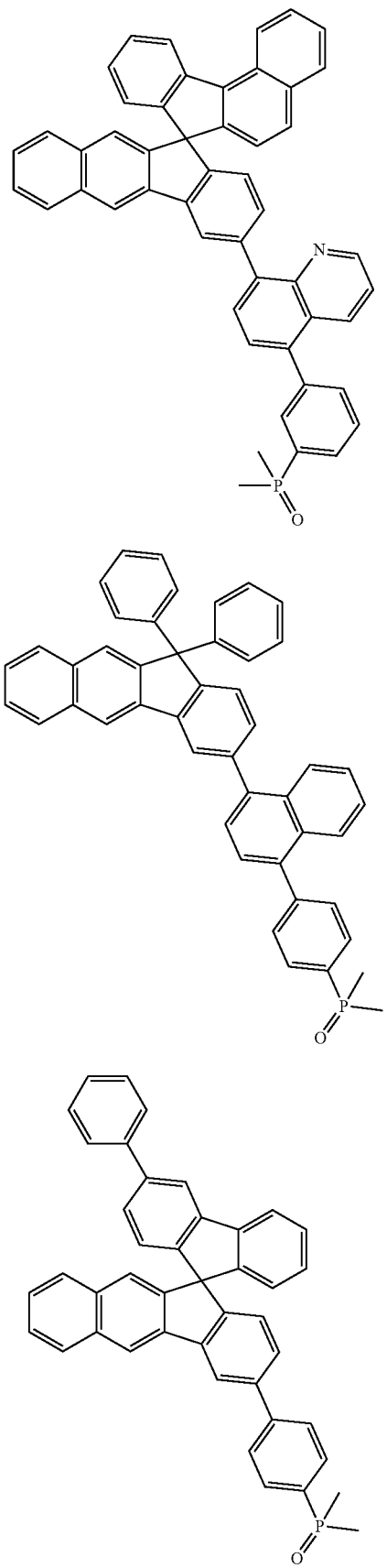

A-45

A-46

A-47

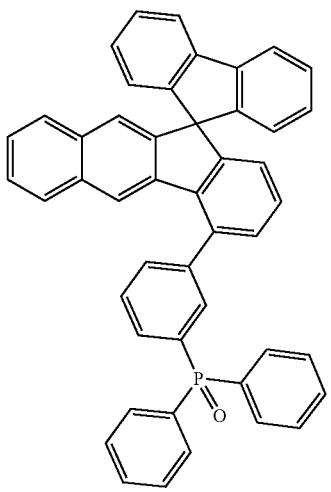

Particularly good performance characteristics are obtained when the compound of Formula (I) is chosen from one or more of the above compounds A-1 to A-47.

In an embodiment the LUMO energy level of the compound of formula (I) is lower than −1.00 eV, alternatively lower than −1.05 ev, alternatively lower than −1.05 eV and higher than −2.00 eV, alternatively lower than −1.05 and higher than −1.90 eV.

In other embodiment the molecular dipole moment of the compound of formula (I) is higher than 0 and lower than 15 Debye, alternatively higher than 1 Debye and lower than 12 Debye, alternatively higher than 2 Debye and lower than 10 Debye, alternatively higher than 3 Debye and lower than 7 Debye.

The objective is further achieved by an organic semiconducting layer comprising the inventive compound of formula (I).

The inventive organic semiconducting layer may further comprise an additive selected from metal, a metal salt, an organic metal complex or a mixture thereof. In this way, electron transport properties of the inventive compound in the organic semiconducting may be improved.

In addition, the object is achieved by an organic electronic device comprising the inventive organic semiconducting layer.

In this regard, the organic electronic device may comprise, between an anode and a cathode and an electrical contact therewith, the organic semiconducting layer and an emission layer, wherein the organic semiconducting layer is arranged between the emission layer and the cathode. In addition, the organic electronic device may further comprise, between the cathode and the anode, an electron transport layer, wherein the organic semiconducting layer is arranged between the electron transport layer and the cathode. The organic semiconducting layer comprising the inventive compound of formula (I) may be the electron transport layer.

The object is further achieved by a display device comprising the inventive organic electronic device.

Likewise, the object is achieved by a lighting device comprising the organic electronic device.

The compounds represented by formula (I) have strong electron transport characteristics to increase charge mobility and/or stability and thereby to improve luminance efficiency, voltage characteristics, and/or life-span characteristics.

The compounds represented by formula (I) effectuate high electron mobility in the inventive organic semiconducting layer and a low operating voltage in the inventive organic electronic device.

According to another aspect of the invention there is provided an organic optoelectronic device comprising an anode layer and a cathode layer facing each other and at least one organic semiconducting layer between the anode layer and the cathode layer, wherein the organic semiconducting layer comprises or consist of the compound of formula I.

It was surprising found that the inventive compounds may advantageously be used as an electron transporting host in organic light emitting diodes (OLEDs), in particular in combination with suitable additives, such as alkali organic salts or alkali organic complexes. It was further surprisingly found that the use of the inventive compounds results in improved device performance, in particular with respect to cd/A efficiency.

Surprisingly, it was found that the compounds of Formula (I) and the inventive organic electronic devices solve the problem underlying the present invention by being superior over the organic electroluminescent devices and compounds known in the art, in particular with respect to cd/A efficiency, also referred to as current efficiency. At the same time the operating voltage is kept at a similar or even improved level which is important for reducing power consumption and increasing battery life, for example of a mobile display device. High cd/A efficiency is important for high efficiency and thereby increased battery life of a mobile device, for example a mobile display device.

Further Layers

In accordance with the invention, the organic electronic device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Either the first electrode or the second electrode may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide ($SnO_2$), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

The hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of 10-8 to 10-3 Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzene-sulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

The HIL may be a pure layer of p-type dopant and the p-type dopant may be selected from tetrafluoro-tetracyano-quinonedimethane (F4TCNQ), 2,2'-(perfluoronaphthalen-2,6-diylidene) dimalononitrile or 2,2',2"-(cyclopropane-1,2,3-triylidene)tris(2-(p-cyanotetrafluorophenyl)acetonitrile) but not limited hereto. The HIL may be selected from a hole-transporting matrix compound doped with a p-type dopant. Typical examples of known doped hole transport materials are: copper phthalocyanine (CuPc), which HOMO level is approximately −5.2 eV, doped with tetrafluoro-tetracyano-quinonedimethane (F4TCNQ), which LUMO level is about −5.2 eV; zinc phthalocyanine (ZnPc) (HOMO=−5.2 eV) doped with F4TCNQ; α-NPD (N,N'-Bis(naphthalen-1-yl)-N,N'-bis(phenyl)-benzidine) doped with F4TCNQ. α-NPD doped with 2,2'-(perfluoronaphthalen-2,6-diylidene) dimalononitrile. α-NPD doped with 2,2',2"-(cyclopropane-1,2,3-triylidene)tris(2-(p-cyanotetrafluorophenyl)acetonitrile). Dopant concentrations can be selected from 1 to 20 wt.-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

The HTL may be formed of any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyl)triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of the electron blocking layer (EBL) is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

The electron blocking layer may comprise a compound of formula Z below.

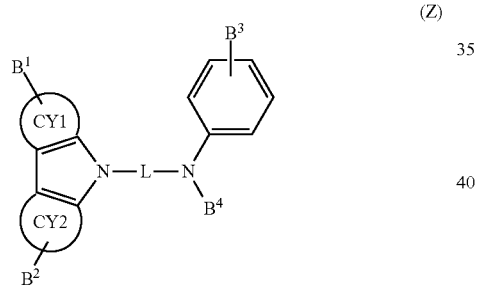

(Z)

In Formula Z, CY1 and CY2 are the same as or different from each other, and each independently represent a benzene cycle or a naphthalene cycle, $B^1$ to $B^3$ are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, $B^4$ is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)-triphenylamine(TCTA), 1,3,5-tris(N-phenylbenzimidazole-2-yl)benzene (TPBI), 3-tert-butyl-9,10-di-2-naphthylanthracenee (TBADN), distrylarylene (DSA), bis(2-(2-hydroxyphenyl)benzo-thiazolate)zinc (Zn(BTZ)2), G3 below, "AND", Compound 1 below.

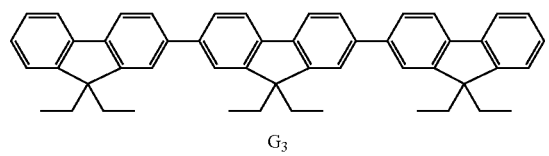

G₃

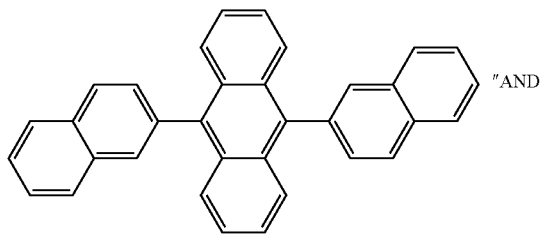

"AND"

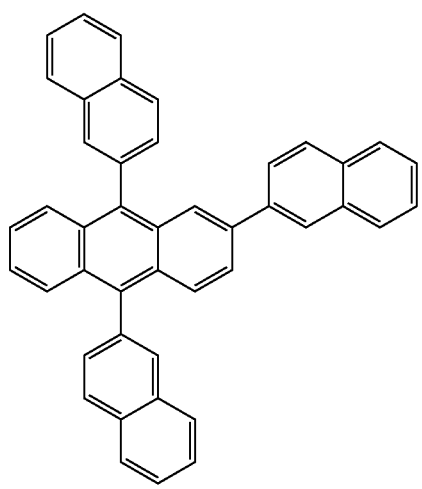

Compound 1

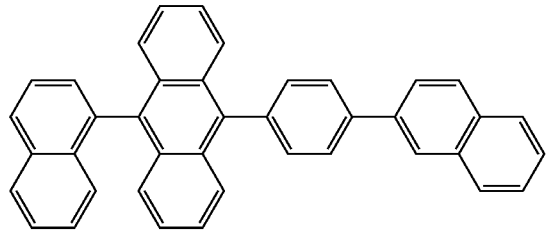

Compound 2

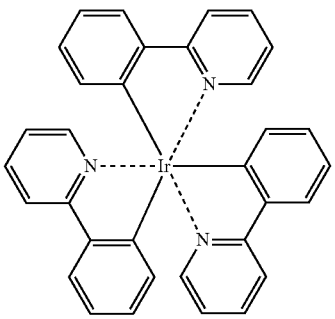

Ir(ppy)₃

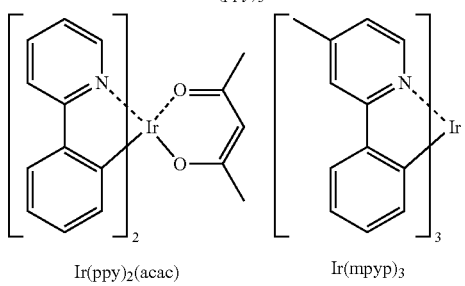

Ir(ppy)₂(acac)    Ir(mpyp)₃

Compound 3

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2Ir(acac), but are not limited thereto. These compounds are phosphorescent emitters, however, fluorescent red emitter dopants could also be used.

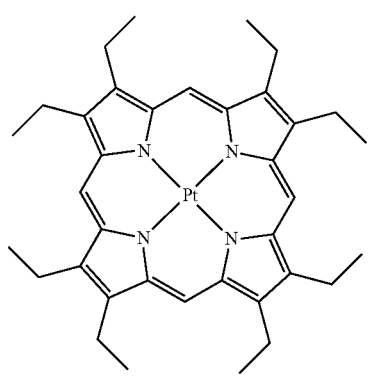

PtOEP

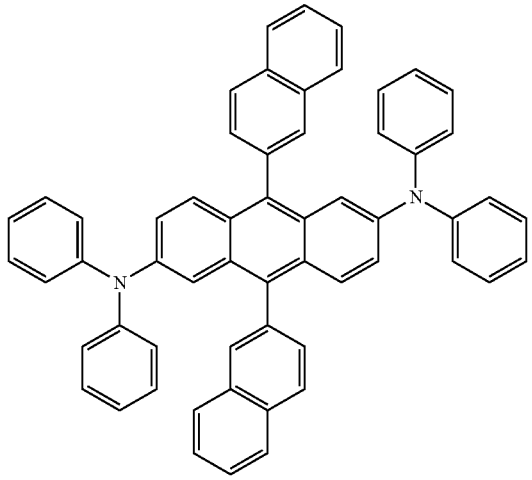

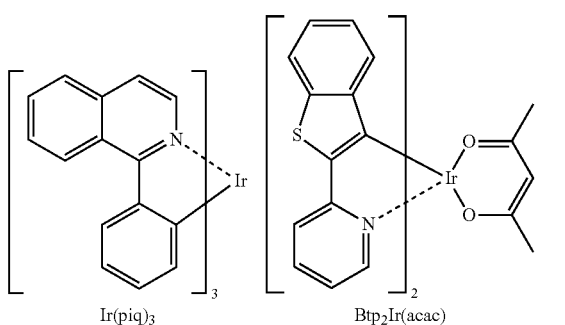

Ir(piq)₃    Btp₂Ir(acac)

Examples of phosphorescent green emitter dopants are Ir(ppy)3 (ppy=phenylpyridine), Ir(ppy)2(acac), Ir(mpyp)3 are shown below. Compound 3 is an example of a fluorescent green emitter and the structure is shown below.

Examples of phosphorescent blue emitter dopants are F2Irpic, (F2ppy)2Ir(tmd) and Ir(dfppz)3, ter-fluorene, the structures are shown below. 4,4'-bis(4-diphenyl amiostyryl) biphenyl (DPAVBi), 2,5,8,11-tetra-tert-butyl perylene (TBPe), and Compound 4 below are examples of fluorescent blue emitter dopants

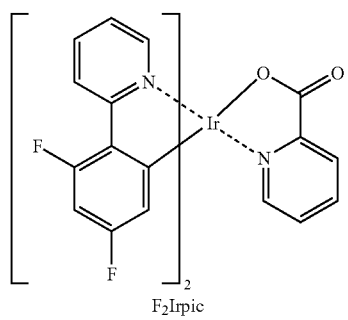

F₂Irpic

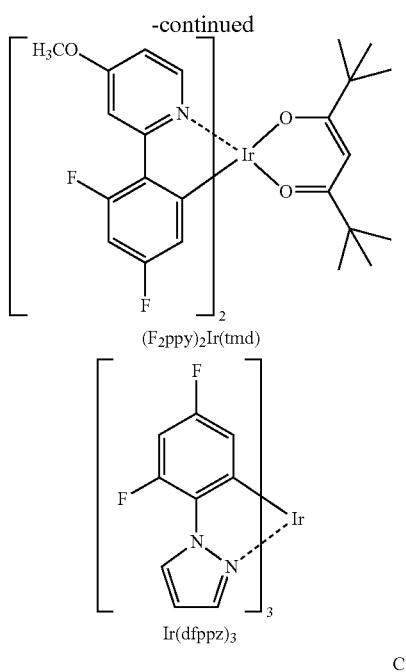

(F₂ppy)₂Ir(tmd)

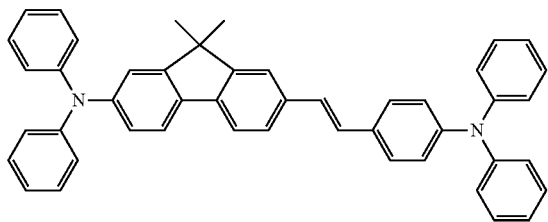

Ir(dfppz)₃

Compound 4

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function. The hole blocking layer may be the inventive organic semiconducting layer comprising the inventive compound represented by the general Formula (I) as defined above. The hole blocking layer may be the inventive organic semiconducting layer consisting of the inventive compound represented by the general Formula (I) as defined above.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The OLED according to the present invention may contain an electron transport layer (ETL). In accordance with the invention, the electron transport layer may be the inventive organic semiconducting layer comprising the inventive compound represented by the general Formula (I) as defined above.

According to various embodiments the OLED may comprise an electron transport layer or an electron transport layer stack comprising at least a first electron transport layer and at least a second electron transport layer.

By suitably adjusting energy levels of particular layers of the ETL, the injection and transport of the electrons may be controlled, and the holes may be efficiently blocked. Thus, the OLED may have long lifetime.

The electron transport layer of the organic electronic device may comprise the compound represented by general formula (I) as defined above as the organic electron transport matrix (ETM) material. The electron transport layer may comprise, besides the compound represented by the general formula (I), further ETM materials known in the art. Likewise, the electron transport layer may comprise as the only electron transport matrix material the compound represented by general formula (I). In case that the inventive organic electronic device comprises more than one electron transport layers, the compound represented by the general formula (I) may be comprised in only one of the electron transport layers, in more than one of the electron transport layers or in all of the electron transport layers. In accordance with the invention, the electron transport layer may comprise, besides the ETM material, at least one additive as defined below. Further, the electron transport layer may comprise one or more n-type dopants. The additive may be an n-type dopant. The additive can be alkali metal, alkali metal compound, alkaline earth metal, alkaline earth metal compound, transition metal, transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. In another embodiment, the n-type dopant can be one selected from a group consisting of Cs, K, Rb, Mg, Na, Ca, Sr, Eu and Yb. In an embodiment the alkali metal compound may be 8-Hydroxyquinolinolato-lithium (LiQ), Lithium tetra(1H-pyrazol-1-yl)borate or Lithium 2-(diphenylphosphoryl)phenolate. Suitable compounds for the ETM (which may be used in addition to the inventive compound represented by the general formula (I) as defined above) are not particularly limited. In one embodiment, the electron transport matrix compounds consist of covalently bound atoms. Preferably, the electron transport matrix compound comprises a conjugated system of at least 6, more preferably of at least 10 delocalized electrons. In one embodiment, the conjugated system of delocalized electrons may be comprised in aromatic or heteroaromatic structural moieties, as disclosed e.g. in documents EP 1 970 371 A1 or WO 2013/079217 A1.

Electron Injection Layer (EIL)

The optional EIL, which may facilitates injection of electrons from the cathode, may be formed on the ETL, preferably directly on the electron transport layer. Examples of materials for forming the EIL include lithium 8-hydroxy-quinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Electrode

The cathode electrode is formed on the EIL if present. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Charge Generation Layer

The charge generation layer (CGL) may comprise a p-type and an n-type layer. An interlayer may be arranged between the p-type layer and the n-type layer. The charge generation layer (CGL) may comprise a compound of Formula (I).

Typically, the charge generation layer is a pn junction joining an n-type charge generation layer (electron generating layer) and a hole generating layer. The n-side of the pn junction generates electrons and injects them into the layer which is adjacent in the direction to the anode. Analogously, the p-side of the p-n junction generates holes and injects them into the layer which is adjacent in the direction to the cathode.

Charge generating layers may be used in tandem devices, for example, in tandem OLEDs comprising, between two electrodes, two or more emission layers. In a tandem OLED comprising two emission layers, the n-type charge generation layer provides electrons for the first light emission layer arranged near the anode, while the hole generating layer provides holes to the second light emission layer arranged between the first emission layer and the cathode.

Suitable matrix materials for the hole generating layer may be materials conventionally used as hole injection and/or hole transport matrix materials. Also, p-type dopant used for the hole generating layer can employ conventional materials. For example, the p-type dopant can be one selected from a group consisting of tetrafluore-7,7,8,8-tetracyanoquinodimethane (F4-TCNQ), derivatives of tetracyanoquinodimethane, radialene derivatives, iodine, FeCl3, FeF3, and SbCl5. Also, the host can be one selected from a group consisting of N,N'-di(naphthalen-1-yl)-N,N-diphenylbenzidine (NPB), N,N'-diphenyl-N,N'-bis(3-methylphenyl)-1,1-biphenyl-4,4'-diamine (TPD) and N,N',N'-tetranaphthylbenzidine (TNB). The p-type charge generation layer may consist of CNHAT.

The n-type charge generation layer can be layer of a neat n-type dopant, for example of an electropositive metal, or can consist of an organic matrix material doped with the n-type dopant. In one embodiment, the n-type dopant can be alkali metal, alkali metal compound, alkaline earth metal, alkaline earth metal compound, a transition metal, a transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the electron generating layer may be the materials conventionally used as matrix materials for electron injection or electron transport layers. The matrix material can be for example one selected from a group consisting of triazine compounds, hydroxyquinoline derivatives like tris(8-hydroxyquinoline) aluminum, benzazole derivatives, and silole derivatives.

The hole generating layer is arranged in direct contact to the n-type charge generation layer.

The n-type charge generation layer may comprise a compound of Formula (I).

Organic Light-Emitting Diode (OLED)

The organic electronic device according to the invention may be an organic light-emitting device.

According to one aspect of the present invention, there is provided an organic light-emitting diode (OLED) comprising: a substrate; an anode electrode formed on the substrate; a hole injection layer, a hole transport layer, an emission layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, an electron injection layer, and a cathode electrode.

According to various embodiments of the present invention, there may be provided OLEDs layers arranged between the above mentioned layers, on the substrate or on the top electrode.

According to one aspect, the OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a hole generating layer, the hole generating layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional injection layer are arranged.

For example, the OLED according to FIG. 2 may be formed by a process, wherein on a substrate (110), an anode (120), a hole injection layer (130), a hole transport layer (140), an electron blocking layer (145), an emission layer (150), a hole blocking layer (155), an electron transport layer (160), an electron injection layer (180) and the cathode electrode (190) are subsequently formed in that order.

Organic Electronic Device

An organic electronic device according to the invention comprises an organic semiconducting layer comprising a compound according to formula I or comprises an organic semiconducting layer consisting of a compound according to formula I.

An organic electronic device according to one embodiment may include a substrate, an anode layer, an organic semiconducting layer comprising a compound of Formula (I) and a cathode layer.

An organic electronic device according to one embodiment comprises at least one organic semiconducting layer comprising at least one compound of formula I, at least one anode layer, at least one cathode layer and at least one emission layer, wherein the organic semiconducting layer is preferably arranged between the emission layer and the cathode layer.

An organic light-emitting diode (OLED) according to the invention may include an anode, a hole transport layer (HTL), an emission layer (EML), an electron transport layer (EITL) comprising at least one compound of Formula (I), and a cathode, which are sequentially stacked on a substrate. In this regard, the HTL, the EML, and the ETL are thin films formed from organic compounds.

An organic electronic device according to one embodiment can be a light emitting device, thin film transistor, a battery, a display device or a photovoltaic cell, and preferably a light emitting device.

According to another aspect of the present invention, there is provided a method of manufacturing an organic electronic device, the method using:

at least one deposition source, preferably two deposition sources and more preferred at least three deposition sources.

The methods for deposition that can be suitable comprise:
deposition via vacuum thermal evaporation;
deposition via solution processing, preferably the processing is selected from spin-coating, printing, casting; and/or
slot-die coating.

According to various embodiments of the present invention, there is provided a method using:

a first deposition source to release the compound of Formula (I) according to the invention, and
a second deposition source to release the alkali halide or alkali organic complex, preferably a lithium halide or lithium organic complex;

the method comprising the steps of forming the electron transport layer stack; whereby for an organic light-emitting diode (OLED):

the first electron transport layer is formed by releasing the compound of Formula (I) according to the invention from the first deposition source and an alkali metal compound, preferably an alkali halide or alkali organic complex, preferably a lithium halide or lithium organic complex from the second deposition source.

According to various embodiments of the present invention, the method may further include forming on the anode electrode an emission layer and at least one layer selected from the group consisting of forming a hole injection layer, forming a hole transport layer, or forming a hole blocking layer, between the anode electrode and the first electron transport layer.

According to various embodiments of the present invention, the method may further include the steps for forming an organic light-emitting diode (OLED), wherein
on a substrate a first anode electrode is formed,
on the first anode electrode an emission layer is formed,
on the emission layer an electron transport layer stack is formed, preferably a first electron transport layer is formed on the emission layer and optional a second electron transport layer is formed,
and finally a cathode electrode is formed,
optional a hole injection layer, a hole transport layer, and a hole blocking layer, formed in that order between the first anode electrode and the emission layer,
optional an electron injection layer is formed between the electron transport layer and the cathode electrode.

According to various embodiments of the present invention, the method may further include forming an electron injection layer on a first electron transport layer. However, according to various embodiments of the OLED of the present invention, the OLED may not comprise an electron injection layer.

According to various embodiments, the OLED may have the following layer structure, wherein the layers having the following order:
anode, hole injection layer, first hole transport layer, second hole transport layer, emission layer, optional second electron transport layer, first electron transport layer comprising a compound of Formula (I) according to the invention, optional electron injection layer, and cathode.

According to another aspect of the invention, it is provided an electronic device comprising at least one organic light emitting device according to any embodiment described throughout this application, preferably, the electronic device comprises the organic light emitting diode in one of embodiments described throughout this application. More preferably, the electronic device is a display device.

In one embodiment, the organic electronic device according to the invention comprising an organic semiconducting layer comprising a compound according to Formula (I) can further comprise a layer comprising a radialene compound and/or a quinodimethane compound.

In one embodiment, the radialene compound and/or the quinodimethane compound may be substituted with one or more halogen atoms and/or with one or more electron withdrawing groups. Electron withdrawing groups can be selected from nitrile groups, halogenated alkyl groups, alternatively from perhalogenated alkyl groups, alternatively from perfluorinated alkyl groups. Other examples of electron withdrawing groups may be acyl, sulfonyl groups or phosphoryl groups.

Alternatively, acyl groups, sulfonyl groups and/or phosphoryl groups may comprise halogenated and/or perhalogenated hydrocarbyl. In one embodiment, the perhalogenated hydrocarbyl may be a perfluorinated hydrocarbyl. Examples of a perfluorinated hydrocarbyl can be perfluormethyl, perfluorethyl, perfluorpropyl, perfluorisopropyl, perfluorobutyl, perfluorophenyl, perfluorotolyl; examples of sulfonyl groups comprising a halogenated hydrocarbyl may be trifluoromethylsulfonyl, pentafluoroethylsulfonyl, pentafluorophenylsulfonyl, heptafluoropropylsufonyl, nonafluorobutylsulfonyl, and like.

In one embodiment, the radialene and/or the quinodimethane compound may be comprised in a hole injection, hole transporting and/or a hole generation layer.

In one embodiment, the radialene compound may have formula (XX) and/or the quinodimethane compound may have formula (XXIa) or (XXIb):

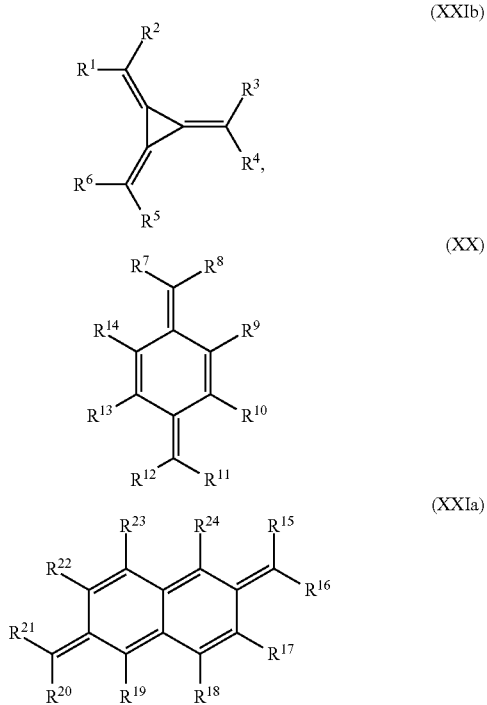

wherein $R^1$, $R^2$, $R^3$, $R^4$, $R^5$, $R^6$, $R^7$, $R^8$, $R^{11}$, $R^{12}$, $R^{15}$, $R^{16}$, $R^{20}$, $R^{21}$ are independently selected from above mentioned electron withdrawing groups and $R^9$, $R^{10}$, $R^{13}$, $R^{14}$, $R^{17}$, $R^{18}$, $R^{19}$, $R^{22}$, $R^{23}$, and $R^{24}$ are independently selected from H, halogen and above mentioned electron withdrawing groups.

Hereinafter, the embodiments are illustrated in more detail with reference to examples. However, the present disclosure is not limited to the following examples. Reference will now be made in detail to the exemplary aspects.

Details and Definitions of the Invention

In the present specification, when a definition is not otherwise provided, an "alkyl group" may refer to an aliphatic hydrocarbon group. The alkyl group may refer to "a saturated alkyl group" without any double bond or triple bond. The term "alkyl" as used herein shall encompass linear as well as branched and cyclic alkyl. For example, $C_3$-alkyl may be selected from n-propyl and isopropyl. Likewise, $C_4$-alkyl encompasses n-butyl, sec-butyl and t-butyl. Likewise, $C_6$-alkyl encompasses n-hexyl and cyclohexyl.

The subscripted number n in $C_n$ relates to the total number of carbon atoms in the respective alkyl, arylene, heteroarylene or aryl group.

The term "aryl" or "arylene" as used herein shall encompass phenyl ($C_6$-aryl), fused aromatics, such as naphthalene, anthracene, phenanthracene, tetracene etc. Further encompassed are biphenyl and oligo- or polyphenyls, such as terphenyl etc. Further encompassed shall be any further aromatic hydrocarbon substituents, such as fluorenyl etc. Arylene, respectively heteroarylene refers to groups to which two further moieties are attached. In the present specification "arylene group" may refer to a group comprising at least one hydrocarbon aromatic moiety, and all the elements of the hydrocarbon aromatic moiety may have p-orbitals which form conjugation, for example a phenyl group, a naphtyl group, an anthracenyl group, a phenanthrenyl group, a pyrenyl group, a fluorenyl group and the like. The arylene group may include a monocyelic, polycyclic or fused ring polycyclic (i.e., rings sharing adjacent pairs of carbon atoms) functional group.

The term "heteroaryl" or "hereroarylene" as used herein refers to aryl groups in which at least one carbon atom is substituted by a heteroatom, preferably selected from N, O, S, B or Si.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

The term "heteroaryl" may refer to aromatic heterocycles with at least one heteroatom, and all the elements of the hydrocarbon heteroaromatic moiety may have p-orbitals which form conjugation. The heteroatom may be selected from N, O, S, B, Si, P, Se, preferably from N, O and S. A heteroarylene ring may comprise at least 1 to 3 heteroatoms. Preferably a heteroarylene ring may comprise at least 1 to 3 heteroatoms individually selected from N, S and/or O.

The term "heteroarylene" as used herewith shall encompass pyridine, quinoline, quinazolinc, pyridine, triazine, benzimidazole, benzothiazole, benzo[4,5]thieno[3,2-d]pyrimidine, carbazole, xanthene, phenoxazine, benzoacridine, dibenzoacridine and the like.

In the present specification, the single bond refers to a direct bond.

The term "fluorinated" as used herein refers to a hydrocarbon group in which at least one of the hydrogen atoms comprised in the hydrocarbon group is substituted by a fluorine atom. Fluorinated groups in which all of the hydrogen atoms thereof are substituted by fluorine atoms are referred to as perfluorinated groups and are particularly addressed by the term "fluorinated".

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

With respect to the inventive organic semiconductive layer as well as with respect to the inventive compound, the compounds mentioned in the experimental part are most preferred.

The inventive organic electronic device may be an organic electroluminescent device (OLED) an organic photovoltaic device (OPV), a lighting device, or an organic field-effect transistor (OFET). A lighting device may be any of the devices used for illumination, irradiation, signaling, or projection. They are correspondingly classified as illuminating, irradiating, signaling, and projecting devices. A lighting device usually consists of a source of optical radiation, a device that transmits the radiant flux into space in the desired direction, and a housing that joins the parts into a single device and protects the radiation source and light-transmitting system against damage and the effects of the surroundings.

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device.

Another aspect is directed to a device comprising at least one organic electroluminescent device (OLED). A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

The energy levels of the highest occupied molecular orbital, also named HOMO, and of the lowest unoccupied molecular orbital, also named LUMO, are measured in electron volt (eV) indirectly by cyclic voltammetry vs ferrocene or can be calculated Such DFT calculations may be carried out using the program package TURBOMOLE V6.5 (Provider: TURBOMOLE GmbH, Litzenhardtstrasse 19, 76135 Karlsruhe, Germany). The optimized geometries and the HOMO/LUMO energy levels of the molecular structures are determined using the hybrid functional B3LYP with a 6-31G* basis set. If more than one conformation is viable, the conformation with the lowest total energy is selected. The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is under-stood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

In the context of the present specification the term "essentially non-emissive" or "non-emitting" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≥780 nm.

Preferably, the organic semiconducting layer comprising the compound of formula I is essentially non-emissive or non-emitting.

The operating voltage, also named U, is measured in Volt (V) at 10 milliAmpere per square centimeter (mA/cm2).

The candela per Ampere efficiency, also named cd/A efficiency is measured in candela per ampere at 10 milli-Ampere per square centimeter (mA/cm2).

The external quantum efficiency, also named EQE, is measured in percent (%).

The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED", "organic light emitting diode", "organic light emitting device", "organic optoelectronic device" and "organic light-emitting diode" are simultaneously used and have the same meaning.

The term "transition metal" means and comprises any element in the d-block of the periodic table, which comprises groups 3 to 12 elements on the periodic table.

The term "group III to VI metal" means and comprises any metal in groups III to VI of the periodic table.

The term "life-span" and "lifetime" are simultaneously used and have the same meaning.

All numeric values are herein assumed to be modified by the term "about", whether or not explicitly indicated. As used herein, the term "about" refers to variation in the numerical quantity that can occur.

Whether or not modified by the term "about" the claims include equivalents to the quantities.

It should be noted that, as used in this specification and the appended claims, the singular forms "a", "an", and "the" include plural referents unless the content clearly dictates otherwise.

The anode electrode and cathode electrode may be described as anode electrode/cathode electrode or anode electrode/cathode electrode or anode electrode layer/cathode electrode layer.

The dipole moment $|\vec{\mu}|$ of a molecule containing N atoms is given by:

$$\vec{\mu} = \sum_i^N q_i \vec{r_i}$$

$$|\vec{\mu}| = \sqrt{\mu_x^2 + \mu_y^2 + \mu_z^2}$$

where $q_i$ and $\vec{r}_i$ are the partial charge and position of atom in the molecule.

The dipole moment is determined by a semi-empirical molecular orbital method.

The partial charges and atomic positions in the gas phase are obtained using the hybrid functional B3LYP with a 6-31G* basis set as implemented in the program package TURBOMOLE V6.5. If more than one conformation is viable, the conformation with the lowest total energy is selected to determine the dipole moment.

The reduction potential may be determined by cyclic voltammetry with potentiostatic device Metrohm PGSTAT30 and software Metrohm Autolab GPES at room temperature. The redox potentials are measured in an argon de-aerated, anhydrous 0.1M THF solution of the compound of formula I, under argon atmosphere, with 0.1M tetrabutylammonium hexafluorophosphate as supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run is done in the broadest range of the potential set on the working electrodes, and the range is then adjusted within subsequent runs appropriately. The final three runs are done with the addition of ferrocene (in 0.1M concentration) as the standard. The average of potentials corresponding to cathodic and anodic peak of the compound is determined through subtraction of the average of cathodic and anodic potentials observed for the standard $Fc^+/Fc$ redox couple.

Room temperature, also named ambient temperature, is 23° C.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
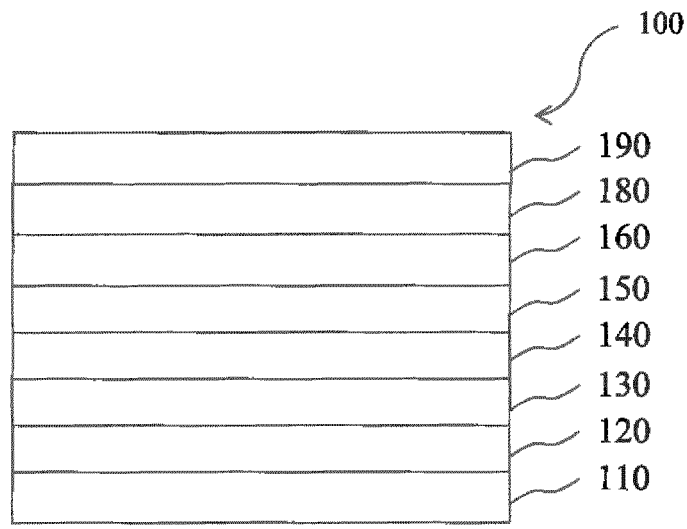
FIG. 1 is a schematic sectional view of an organic light-emitting diode OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

FIG. 1 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 is formed on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (multiple ETL) can be used.

Figure 2:
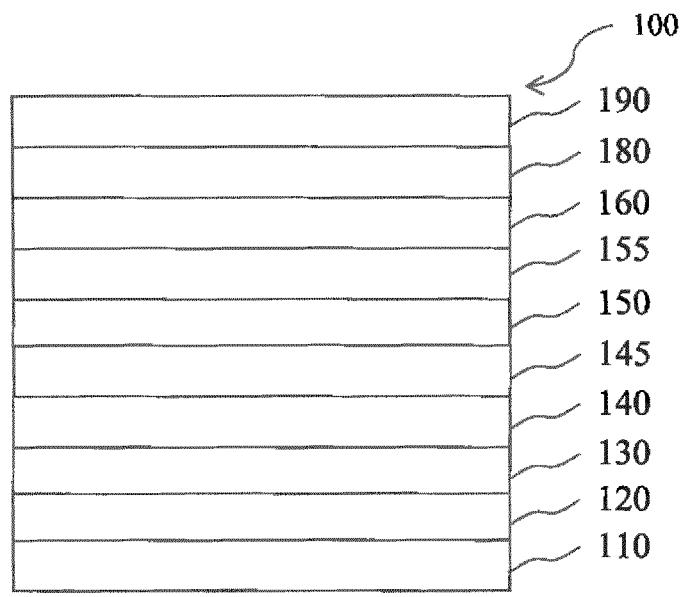
FIG. 2 is a schematic sectional view of an OLED comprising an electron blocking layer (EBL) and a hole blocking layer (HBL), according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Figure 3:
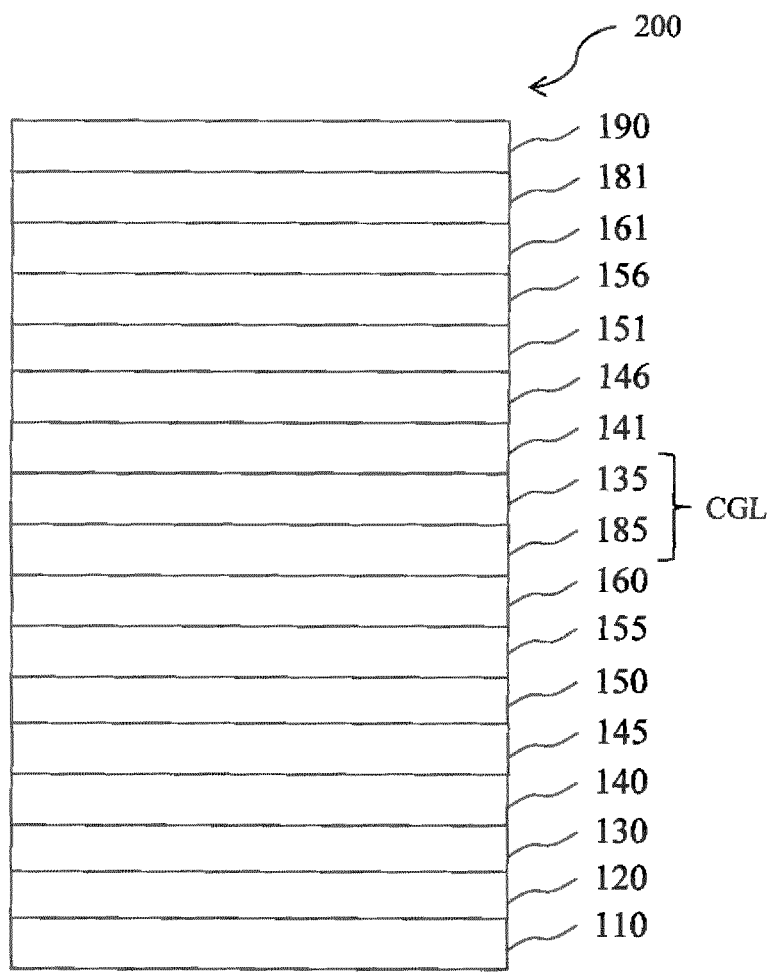
FIG. 3 is a schematic sectional view of a tandem OLED comprising a charge generation layer, according to an exemplary embodiment of the present invention.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer (CGL) and a second emission layer (151).

Referring to FIG. 3, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

The features disclosed in the foregoing description, in the claims and/or in the accompanying drawings may, both separately and in any combination thereof, be material for realizing the invention in diverse forms thereof.

Preparation of the Inventive Compounds
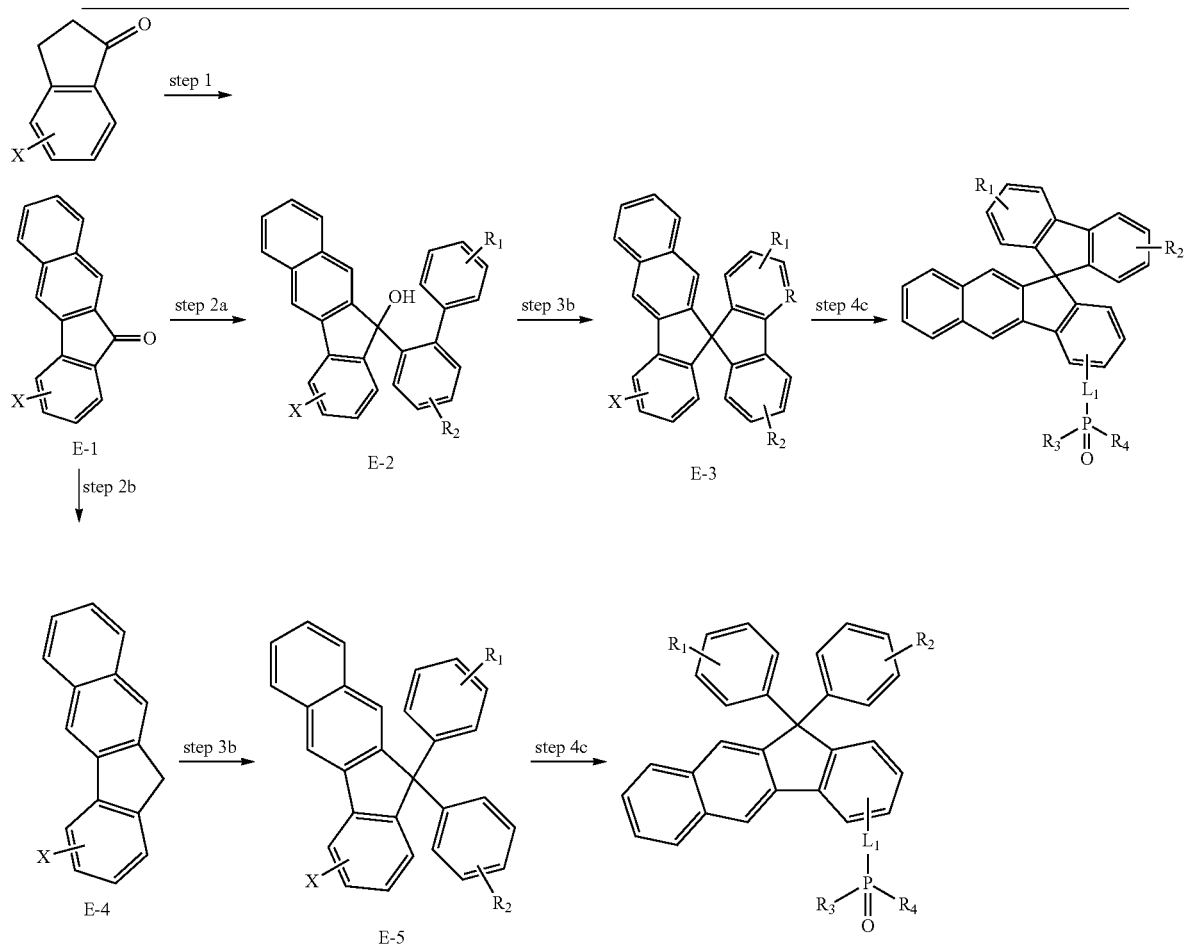
Scheme 1a.
General scheme for compounds (A-1, A-5, A-8, A-11, A-13, A-16, A-17, A-18, A-20, A-26, A-27, A-31, A-32, A-34, A-37, A-38, A-39, A-42, A-43, A-44, A-46, A-47, A-10, A-21, A-22, A-24, A-29, A-33, A-36, A-45). Steps 1, 2b, 3b according to WO2015033559
X = Br, Cl; R1, R2 = H, fused Ph
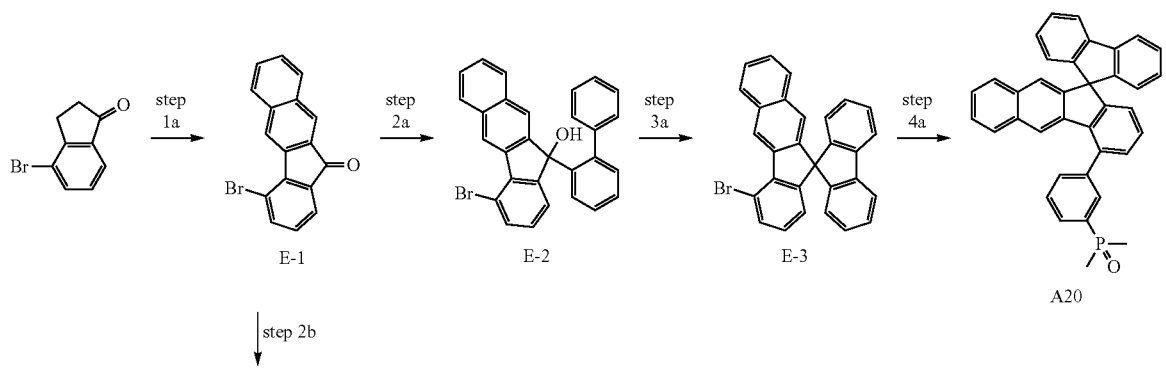
Scheme 1b. Example for Scheme 1a -continued
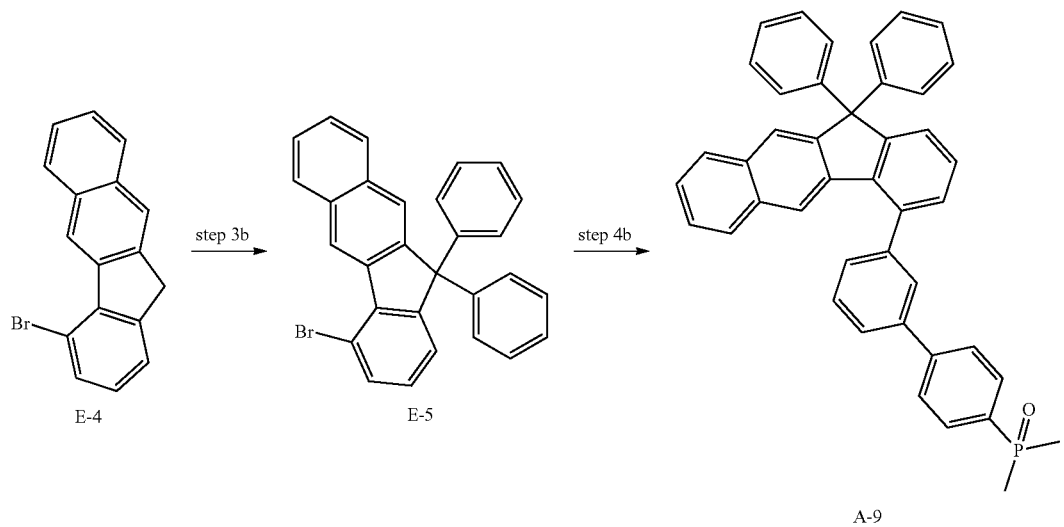
E-4 → step 3b → E-5 → step 4b → A-9
Scheme 2a - Synthesis of intermediate ketone for compounds (A-2, A-3, A-4, A-14, A-15, A-28, A-30, A-40, A-41). Following steps according to Scheme 1a.
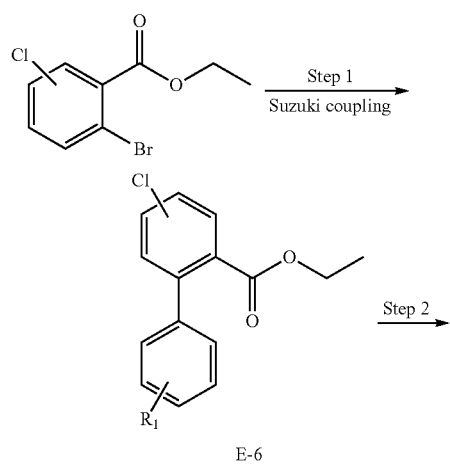
Step 1
Suzuki coupling
E-6
Journal of Materials Chemistry (2010), 20(47), 10735-10746
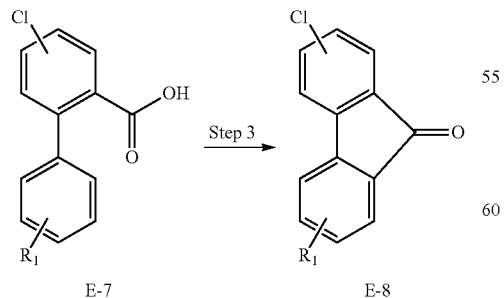
Step 3
E-7    E-8
R1 = fused Ph
Scheme 3a.
General scheme for compounds (A-7, A-12, A-19, A-23, A-25, A-35). Steps 1-4 according to US20160181542A1.
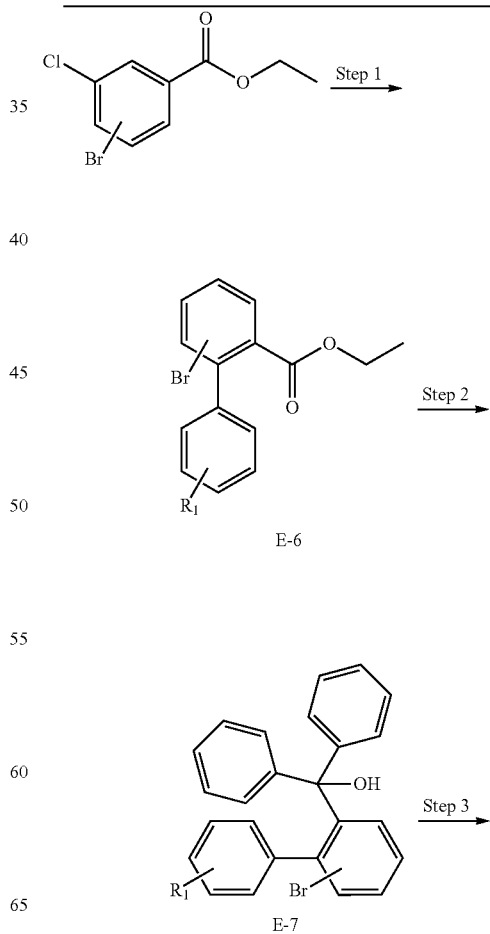
Step 1
Step 2
E-6
Step 3
E-7

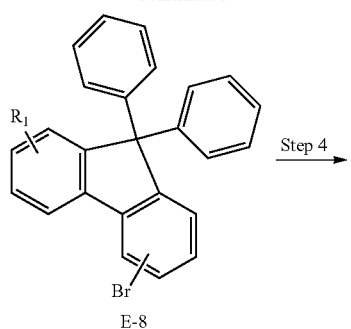
E-8
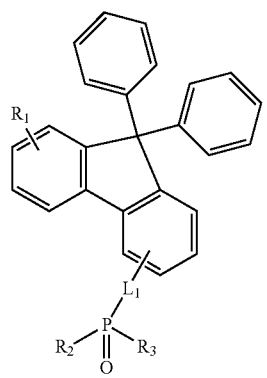
R1 = fused Ph
Scheme 3b. Example for Scheme 3a
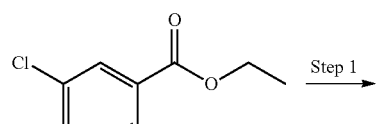
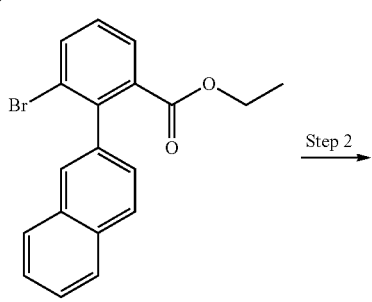
E-6
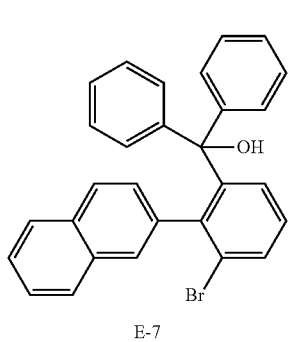
E-7
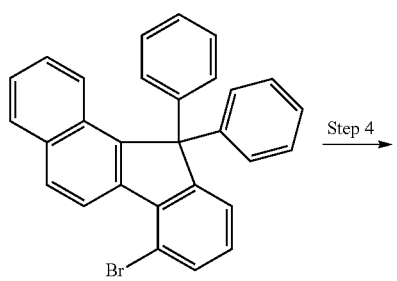
E-8
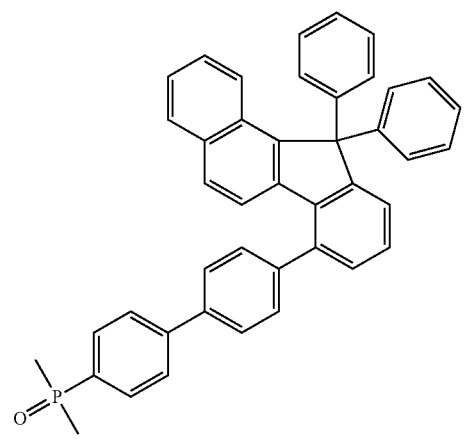
A-12
Synthesis of dimethyl(3-(spiro[benzo[b]fluorene-11,
9'-fluoren]-4-yl)phenyl)phosphine oxide (A-20)
(Scheme 1b)
Synthesis of 4-bromo-11H-benzo[b]fluoren-11-one was carried out according to the literature (WO 2015033559)
Synthesis of 11-([1,1'-biphenyl]-2-yl)-4-bromo-11H-benzo[b]fluoren-11-ol
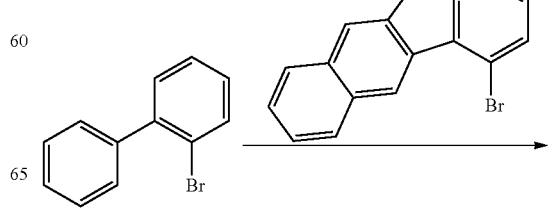

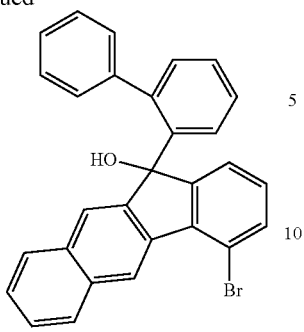

s-BuLi (1.4M in cyclohexane, 55.3 mL, 77.1 ol, 2.9 eq.) was added dropwise to a solution of 2-bromo-1,1'-biphenyl (18.6 g, 13.8 mL, 79.8 mmol, 3.0 eq.) in dried THF (200 mL) at −80° C. solution was stirred at −80° C. for 1 h and 45 min. A suspension was formed. 4-bromo-11H-benzo[b]fluoren-11-one (8.2 g, 26.6 g, 1.0 eq.) was then added at −80° C. and the mixture was stirred at this temperature. After 40 min, full conversion was observed. MeOH (10 mL) and water was added, and the crude reaction mixture was warm it up to room temperature. Then, it was extracted with ethylacetate. The combined organic phase was washed with brine, dried with Na2CO3 and solvents were removed under vacuum. 30 ml of mixture ethylacetate/hexane 5/95 was added to the solid and heated to reflux for a minute. The white solid was filtered off and washed with small amount of the ethylacetate/hexane 5/95 mixture and then hexanes to obtain 10.3 g (83% yield) of 11-([1,1'-biphenyl]-2-yl)-4-bromo-11H-benzo[b]fluoren-11-ol. APCI-MS: 445 (M-OH).

Synthesis of 4-bromospiro[benzo[b]fluorene-11,9'-fluorene]

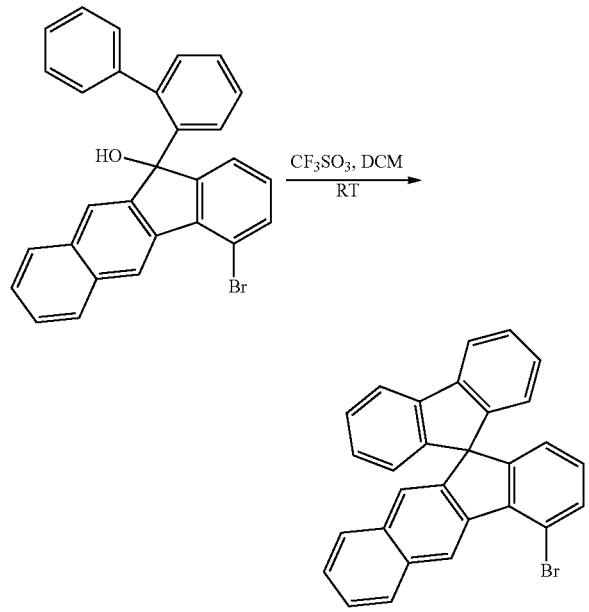

Trifluoromethansulfonic acid (0.2 mL, 2.2 mmol, 0.1 eq.) was added to a solution of 11-([1,1'-biphenyl]-2-yl)-4-bromo-11H-benzo[b]fluoren-11-ol (10.3 g, 22.2 mmol, 1.0 eq.) in anhydrous dichloromethane (30 mL), s and the mixture was stirred at room temperature for 1.5 h. The suspension was cooled to 0° C. and the solid filtered and washed with a mixture of dichloromethane/hexane=5/95 to obtain 8.9 g (89% yield) of 4-bromospiro[benzo[b]fluorene-11,9'-fluorene]. APCI-MS: 445 (M+H).

Synthesis of dimethyl(3-(spiro[benzo[b]fluorene-11,9'-fluoren]-4-yl)phenyl)phosphine oxide (A-20)

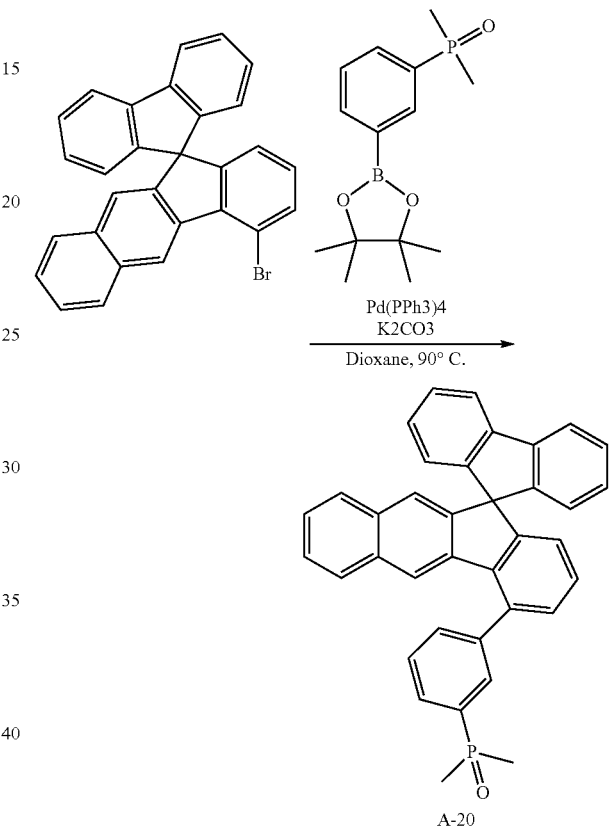

4-bromospiro[benzo[b]fluorene-11,9'-fluorene] (10 g, 22.5 mmol, 1.0 eq.), dimethyl(3-(4,4,5,5-tetramethyl-1,3,2-dioxaborolan-2-yl)phenyl)phosphine oxide (6.9 g, 24.7 mmol, 1.1 eq.) and potassium carbonate (6.2 g, 44.9 mmol, 2.0 eq.) were placed in a flask der a nitrogen stream. Dioxane (90 mL) and water (22 ere added and the mixture was degassed with nitrogen. Then, tetrakis(triphenylphosphine)palladium(0) (519 mg, 0.4 mmol, 0.02 eq.) was added under a nitrogen stream. The reaction mixture was stirred under nitrogen overnight at 90° C. The reaction mixture was cooled down and solvent was removed under vacuum. The crude residue was dissolved in dichloromethane (30 mL), then toluene was added (130 mL) and the solvents were removed under vacuum (till 50 mL). The precipitated was filtered, dissolved in chloroform and filtered over florisil using chloroform as eluent. Chloroform was partially removed under vacuum, then toluene was added and the solvents were removed under vacuum (till 50 mL). Solid was filtered to obtain 4.7 g (40% yield) of dimethyl(3-(spiro[benzo[b]fluorene-11,9'-fluoren]-4-yl)phenyl)phosphine oxide. MS (ESI): 519 (M+H), 541 (M+Na).

Synthesis of diphenyl(3-(spiro[benzo[b]fluorene-11, 9'-fluoren]-4-yl)phenyl)phosphine oxide (A-47) (Scheme 1a)

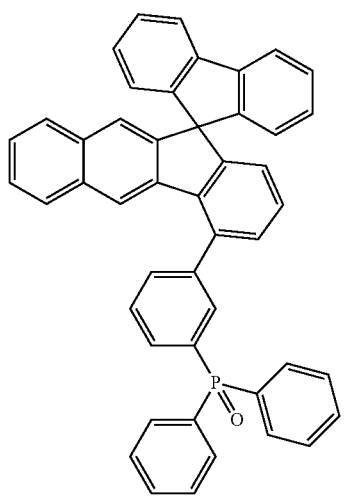

A-47

Synthesis of diphenyl(3-(spiro[benzo[b]fluorene-11,9'-fluoren]-4-yl)phenyl)phosphine oxide was performed according to the procedure described for dimethyl(3-(spiro[benzo[b]fluorene-11,9'-fluoren]-4-yl)phenyl)phosphine oxide (A-20) using diphenyl(3-(4,4,5,5-tetramethyl-1,3,2-dioxaborolan-2-yl)phenyl)phosphine oxide.

4-bromospiro[benzo[b]fluorene-11,9'-fluoren] (15.0 g, 33.7 mmol, 1.0 eq.), diphenyl(3-(4,4,5,5-tetramethyl-1,3,2-dioxaborolan-2-yl)phenyl)phosphine oxide (13.6 g, 33.7 mmol, 1.0 eq.) and potassium carbonate (13.9 g, 67.4 mmol, 2.0 eq.) were placed in a flask under a nitrogen stream. Dioxane (135 mL) and water (51 mL) were added and the mixture was degassed with nitrogen. Then, tetrakis(triphenylphosphine)palladium(0) (1.16 g, 1 mmol, 0.03 eq.) was added under a nitrogen stream. The reaction mixture was stirred under nitrogen overnight at 90° C. The reaction mixture was cooled down and solvent was removed under vacuum. The crude residue was dissolved in dichloromethane (200 mL) and washed with deionized water (3×100 ml). Organic phase was dried over MgSO4 and concentrated to ca. 100 ml. To this residue 150 ml of n-hexane was added and the mixture was stirred overnight. Formed solid was filtered-off and recrystallized from toluene (250 ml). Isolated solid was recrystallized from chlorobenzene (100 ml) to obtain 12 g (55%) of diphenyl(3-(spiro[benzo[b]fluorene-11,9'-fluoren]-4-yl)phenyl)phosphine oxide MS (ESI): 643 (M+H), 665 (M+Na).

General Procedure for Fabrication of Organic Electronic Devices

In general organic electronic devices may be organic light-emitting diodes (OLEDs), organic photovoltaic cells (OSCs), organic field-effect transistors (OFETs) or organic light emitting transistors (OLETs). Organic electronic light-emitting devices such as OLED and OLET may be part of a lighting device.

Any functional layer in the organic electronic device may comprise a compound of Formula (I) or may consist of a compound of formula 1.

An OLED may be composed of individual functional layers to form a top-emission OLED which emits light through the top electrode. Herein, the sequence of the individual functional layers may be as follows wherein contact interfaces between the individual layers are shown as "/": non-transparent anode layer (bottom electrode)/hole injection layer/hole transport layer/electron blocking layer/emission layer/hole blocking layer/electron transport layer/electron injection layer/transparent cathode layer (top electrode). Each layer may in itself be constituted by several sub-layers.

An OLED may be composed of individual functional layers to form a bottom-emission OLED which emits light through the bottom electrode. Herein, the sequence of the individual functional layers may be as follows wherein contact interfaces between the individual layers are shown as "/": transparent anode layer (bottom electrode)/hole injection layer/hole transport layer/electron blocking layer/emission layer/hole blocking layer/electron transport layer/electron injection layer/non-transparent cathode layer (top electrode). Each layer may in itself be constituted by several sub-layers.

Top-emission OLED devices were prepared to demonstrate the technical benefit utilizing the compounds of Formula (I) in an organic electronic device.

Fabrication of Top Emission OLED Devices

For all top emission devices, inventive examples 1 and 2 and comparative example 1, a glass substrate was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode. 100 nm Ag were deposited at a pressure of $10^{-5}$ to $10^{-7}$ mbar to form the anode. Then, 92 vol.-% N-([1,1'-biphenyl]-4-yl)-9,9-dimethyl-N-(4-(9-phenyl-9H-carbazol-3-yl)phenyl)-9H-fluoren-2-amine (CAS 1242056-42-3) with 8 vol.-% 4,4',4"-((1E,1'E,1"E)-cyclopropane-1,2,3-triylidenetris(cyanomethanylylidene))tris(2,3,5,6-tetrafluorobenzonitrile) was vacuum deposited on the Ag electrode, to form a HIL having a thickness of 10 nm. Then, N-([1,1'-biphenyl]-4-yl)-9,9-dimethyl-N-(4-(9-phenyl-9H-carbazol-3-yl)phenyl)-9H-fluoren-2-amine (CAS 1242056-42-3) was vacuum deposited on the HIL, to form a HTL having a thickness of 118 nm. Then, N,N-bis(4-(dibenzo[b,d]furan-4-yl)phenyl)-[1,1':4',1"-terphenyl]-4-amine (CAS 1198399-61-9) was vacuum deposited on the HTL, to form an electron blocking layer (EBL) having a thickness of 5 nm.

Subsequently, the emission layer was deposited. In comparative examples 1 and 2, and in examples 1, 2, 4, 5 and 6, 97 vol.-% 2-(10-phenyl-9-anthracenyl)-benzo[b]naphtho[2,3-d]furan (CAS 1627916-48-6) as EML host mid 3 vol.-% BD200 (Sun Fine Chemicals) as fluorescent blue dopant were deposited on the EBL to form a blue-emitting EML with a thickness of 20 nm. In example 3, 97 vol.-% H09 (Fluorescent-blue host material) and 3 vol.-% BD200 (Sun Fine Chemicals) as fluorescent blue dopant were deposited on the EBL to form a blue-emitting EML with a thickness of 20 nm.

Then, for comparative example 1 and examples 2, 3 and 6 the hole blocking layer is formed with a thickness of 5 nm by depositing 2,4-diphenyl-6-(4',5',6'-triphenyl-[1,1':2',1":3",1'":3'",1''''-quinquephenyl]-3''''-yl)-1,3,5-triazine (CAS 2032364-64-8) on the emission layer. For example 4, the hole blocking layer is formed with a thickness of 5 nm by depositing a 7:3 vol.-% mixture of 9-([1,1'-biphenyl]-3-yl)-9'-([1,1'-biphenyl]-4-yl)-9H,9'H-3,3'-bicarbazole and 2,4-diphenyl-6-(3'-(triphenylen-2-yl)-[1,1'-biphenyl]-3-yl)-1,3,5-triazine on the emission layer. For comparative example 2 and example 1 and 5 no hole blocking layer was deposited.

Then, the electron transporting layer is formed on the hole blocking layer with a thickness of 31 nm. The electron transport layer comprises compounds of Formula (I) (or a comparative compound) as matrix compounds and an additive, compositions according to Table 2 and Table 3.

Then, the electron injection layer is formed on the electron transporting layer by deposing Yb with a thickness of 2 nm. Ag is evaporated at a rate of 0.01 to 1 Å/s at $10^{-7}$ mbar to form a cathode with a thickness of 11 nm. A cap layer of N-([1,1'-biphenyl]-4-yl)-9,9-dimethyl-N-(4-(9-phenyl-9H-carbazol-3-yl)phenyl)-9H-fluoren-2-amine (CAS 1242056-42-3) is formed on the cathode with a thickness of 75 nm.

The OLED stack is protected from ambient conditions by encapsulation of the device with a glass slide. Thereby, a cavity is formed, which includes a getter material for further protection.

To assess the performance of the inventive examples compared to the existing art, the light output of the top emission OLEDs is measured under ambient conditions (20° C.). Current voltage measurements are performed using a Keithley 2400 sourcemeter, and recorded in V. At 10 mA/cm$^2$ for top emission devices, a spectrometer CAS140 CT from Instrument Systems, which has been calibrated by Deutsche Akkreditierungsstelle (DAkkS), is used for measurement of CIE coordinates and brightness in Candela. The current efficiency Ceff is determined at 10 mA/cm$^2$ in cd/A.

To assess the performance of the inventive examples compared to the prior art, the current efficiency is measured at 20° C. The current-voltage characteristic is determined using a Keithley 2635 source measure unit, by sourcing a voltage in V and measuring the current in mA flowing through the device under test. The voltage applied to the device is varied in steps of 0.1V in the range between 0V and 10V. Likewise, the luminance-voltage characteristics and CIE coordinates are determined by measuring the luminance in cd/m$^2$ using an Instrument Systems CAS-140CT array spectrometer from Instrument Systems, which has been calibrated by Deutsche Akkreditierungsstelle (DAkkS), for each of the voltage values. The cd/A efficiency at 10 mA/cm$^2$ is determined by interpolating the luminance-voltage and current-voltage characteristics, respectively.

In top emission devices, the emission is forward directed, non-Lambertian and also highly dependent on the microcavity. Therefore, the external quantum efficiency (EQE) and power efficiency in 1 m/W will be higher compared to bottom emission devices.

Compounds Used

| IUPAC name | Reference |
|---|---|
| N-([1,1'-biphenyl]-4-yl)-9,9-dimethyl-N-(4-(9-phenyl-9H-carbazol-3-yl)phenyl)-9H-fluoren-2-amine (CAS 1242056-42-3) | US2016322581 |
| 4,4',4''-((1E,1'E,1''E)-cyclopropane-1,2,3-triylidenetris(cyanomethanylylidene))tris(2,3,5,6-tetrafluorobenzonitrile) | US2008265216 |
| N,N-bis(4-(dibenzo[b,d]furan-4-yl)phenyl)-[1,1':4',1''-terphenyl]-4-amine (CAS 1198399-61-9) | JP2014096418 |
| 2-(10-phenyl-9-anthracenyl)-benzo[b]naphtho[2,3-d]furan (CAS 1627916-48-6) (Fluorescent-blue host material) | EP2924029 |
| H09 (Fluorescent-blue host material) | Commercially available from Sun Fine Chemicals, Inc, S. Korea |

-continued

| IUPAC name | Reference |
|---|---|
| BD200 (Fluorescent-blue emitter material) | Commercially available from Sun Fine Chemicals, Inc, S. Korea |
| 2,4-diphenyl-6-(4',5',6'-triphenyl-[1,1':2',1'':3'',1''':3''',1''''-quinquephenyl]-3''''-yl)-1,3,5-triazine (CAS 2032364-64-8) | WO 2016171358 |
| 9-([1,1'-biphenyl]-3-yl)-9'-(1,1'-biphenyl]-4-yl)-9H,9'H-3,3'-bicarbazole | — |
| 2,4-diphenyl-6-(3'-(triphenylen-2-yl)-[1,1'-biphenyl]-3-yl)-1,3,5-triazine | WO 2015115744 |
| 8-Hydroxyquinolinolato-lithium (CAS 850918-68-2) = LiQ = Additive-1 | WO2013079217 |
| Lithium tetra(1H-pyrazol-1-yl)borate (CAS 14728-62-2) = Additive-2 | US20140332789 |
| Ytterbium (Yb) (CAS 7440-64-4) = Additive-3 | US2016322568 |

Melting Point

The melting point (Tm) is determined as peak temperatures from the DSC curves of the above TGA-DSC measurement or from separate DSC measurements (Mettler Toledo DSC822e, heating of samples from room temperature to completeness of melting with heating rate 10 K/min under a stream of pure nitrogen. Sample amounts of 4 to 6 mg are placed in a 40 μL Mettler Toledo aluminum pan with lid, a <1 mm hole is pierced into the lid).

Glass Transition Temperature

The glass transition temperature (Tg) is measured under nitrogen and using a heating rate of 10 K per min in a Mettler Toledo DSC 822e differential scanning calorimeter as described in DIN EN ISO 11357, published in March 2010.

Rate Onset Temperature

The rate onset temperature ($T_{RO}$) for transfer into the gas phase is determined by loading 100 mg compound into a VTE source. As VTE source a point source for organic materials is used as supplied by Kurt J. Lesker Company (www.lesker.com) or CreaPhys GmbH (http://www.creaphys.com). The VTE (vacuum thermal evaporation) source temperature is determined through a thermocouple in direct contact with the compound in the VTE source.

The VTE source is heated at a constant rate of 15 K/min at a pressure of $10^{-7}$ to $10^{-8}$ mbar in the vacuum chamber and the temperature inside the source measured with a thermocouple. Evaporation of the compound is detected with a QCM detector which detects deposition of the compound on the quartz crystal of the detector. The deposition rate on the quartz crystal is measured in Angstrom per second. To determine the rate onset temperature, the deposition rate on a logarithmic scale is plotted against the VTE source temperature. The rate onset is the temperature at which noticeable deposition on the QCM detector occurs (defined as a rate of 0.02 Å/s. The VTE source is heated and cooled three time and only results from the second and third run are used to determine the rate onset temperature. The rate onset temperature is an indirect measure of the volatility of a compound. The higher the rate onset temperature the lower is the volatility of a compound.

Technical Effect of the Invention

Material Property

The Tg of compounds of Formula (I) (Table 2) are increased versus the comparative compounds of existing art (Table 1). The values are in a range suitable for use in or organic electronic devices. High Tg values of materials used in organic electronics are generally preferred for device durability and robustness.

Top Emission OLED Devices

Surprisingly, the cd/A current efficiencies were increased using compounds of Formula (I) mixed with an additive as an electron transport layer (Table 2).

Surprisingly, the lifetime LT97 of top emission OLED devices is increased when using compounds of Formula (I) mixed with an additive as an electron transport layer (Table 3).

Three different of additives were tested, as specified in the overview of compounds used.

In summary, improved LT97 lifetime of top emission OLED devices and increased cd/A efficiency may be achieved when the electron transporting organic semiconductor layer comprises a compound of Formula (I). High performance may be achieved for a range of additives.

Table 4 shows the LUMO energy levels and the molecular dipole moments of compounds of Formula (I).

Table 1: Structural formulae, glass transition temperatures, melting temperatures, rate onset temperatures of comparative and inventive compounds.

TABLE 1

| Name | | Formula | $T_g$ [° C.] | $T_m$ [° C.] | $T_{RO}$ [° C.] |
|---|---|---|---|---|---|
| Comparative Compound 1 | Comparative-1 | | 130 | 234 | 207 |
| Comparative Compound 2 | Comparative-2 | | 120 | 268 | 232 |
| Inventive Compound 1 | A-20 | | 140 | 236 | 184 |

TABLE 1-continued

| Name | | Formula | Tg [° C.] | Tm [° C.] | T$_{RO}$ [° C.] |
|---|---|---|---|---|---|
| Inventive Compound 2 | A-47 | | 136 | 277 | 222 |

TABLE 2

Performance data of top emission OLED devices comprising an electron transport layer, which comprise the compounds of Formula (I) a comparative compound as matrix compound, and an additive. OLEDs comprising compounds of Formula (I) show increased cd/A efficiencie Ceff.

| | Matrix compound | vol.-% of matrix compound | additive | vol.-% alkali metal compound | Total Thickness ETL/nm | CIE 1931 y | cd/A efficiency Ceff at 10 mA/cm$^2$ (cd/A) |
|---|---|---|---|---|---|---|---|
| Comparative Example 1 | Comparative-1 | 50 | Additive-1 (LiQ) | 50 | 31 | 0.046 | 7.6 |
| Example 1 | A-20 | 50 | Additive-1 (LiQ) | 50 | 31 | 0.042 | 8.0 |
| Example 2 | A-20 | 50 | Additive-1 (LiQ) | 50 | 31 | 0.043 | 7.8 |
| Example 3 | A-20 | 95 | Additive-3 (Yb) | 5 | 31 | 0.047 | 8.2 |

TABLE 3

Lifetime LT97 of an organic electroluminescent devices comprising an electron transport layer which comprises the compounds of Formula (I) or a comparative compound as matrix compound, and an additive. OLEDs comprising compounds of Formula (I) show increased Lifetime LT97.

| | Matrix compound | Concentration of matrix compound (vol.-%) | Additive | Concentration of additive (vol.-%) | Thickness electron transport layer (nm) | CIEy | Lifetime LT97 (hours) |
|---|---|---|---|---|---|---|---|
| Comparative example 2 | Comparative-2 | 50 | Additive-1 (LiQ) | 50 | 31 | 0.049 | 145 |
| Example 4 | A-20 | 70 | Additive-2 | 30 | 31 | 0.045 | 285 |
| Example 5 | A-20 | 50 | Additive-1 (LiQ) | 50 | 31 | 0.042 | 248 |
| Example 6 | A-20 | 50 | Additive-1 (LiQ) | 50 | 31 | 0.043 | 164 |

TABLE 4

Calculated LUMO Levels and Dipole Moments for molecules of Formula (I).

| Compound Name | LUMO (eV) | Dipole Moment (Debye) |
|---|---|---|
| A-1 | −1.26 | 3.78 |
| A-2 | −1.27 | 4.17 |
| A-3 | −1.27 | 4.45 |
| A-4 | −1.31 | 4.41 |
| A-5 | −1.31 | 4.03 |
| A-6 | −1.32 | 4.53 |
| A-7 | −1.34 | 4.41 |
| A-8 | −1.34 | 4.35 |
| A-9 | −1.35 | 4.15 |
| A-10 | −1.35 | 4.42 |
| A-11 | −1.35 | 4.45 |
| A-12 | −1.36 | 4.33 |
| A-13 | −1.37 | 4.23 |
| A-14 | −1.38 | 4.55 |
| A-15 | −1.39 | 4.43 |
| A-16 | −1.39 | 4.07 |
| A-17 | −1.39 | 4.17 |
| A-18 | −1.40 | 4.00 |
| A-19 | −1.41 | 4.19 |
| A-20 | −1.43 | 4.41 |
| A-21 | −1.44 | 4.20 |
| A-22 | −1.45 | 4.19 |
| A-23 | −1.46 | 4.23 |
| A-24 | −1.48 | 4.25 |
| A-25 | −1.49 | 4.22 |
| A-26 | −1.53 | 4.06 |
| A-27 | −1.55 | 4.40 |
| A-28 | −1.55 | 4.17 |
| A-29 | −1.56 | 4.11 |
| A-30 | −1.56 | 4.47 |
| A-31 | −1.56 | 4.39 |
| A-32 | −1.56 | 4.31 |
| A-33 | −1.56 | 4.16 |
| A-34 | −1.57 | 4.28 |
| A-35 | −1.57 | 4.25 |
| A-36 | −1.57 | 4.38 |
| A-37 | −1.49 | 4.70 |
| A-38 | −1.56 | 4.74 |
| A-39 | −1.34 | 3.98 |
| A-40 | −1.39 | 4.14 |
| A-41 | −1.32 | 3.69 |
| A-42 | −1.43 | 4.36 |
| A-43 | −1.75 | 4.28 |
| A-44 | −1.63 | 5.73 |
| A-45 | −1.39 | 4.28 |
| A-46 | −1.37 | 4.27 |
| A-47 | −1.26 | 3.75 |

While invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

The features disclosed in the foregoing description and in the claims may, both separately or in any combination, be material for realizing the invention in diverse forms thereof.

The invention claimed is:

1. A compound represented by the general Formula (I):

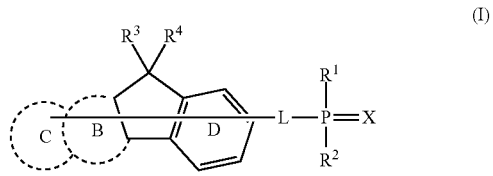

wherein

X is selected from the group consisting of O, S and Se;

$R^1$ and $R^2$ are independently selected from the group consisting of $C_1$ to $C_{12}$ alkyl, $C_6$ to $C_{20}$ aryl and $C_5$ to $C_{20}$ heteroaryl, wherein the respective $C_1$ to $C_{12}$ alkyl optionally is substituted with $C_6$-$C_{20}$ aryl;

L represents a single bond or is selected from the group consisting of $C_6$ to $C_{18}$ arylene or $C_2$ to $C_{20}$ heteroarylene;

wherein the rings B, C and D are each unsubstituted or substituted and B and C are anellated aromatic rings;

$R^3$ and $R^4$ are independently selected from the group consisting of unsubstituted or substituted $C_1$ to $C_{12}$ alkyl, unsubstituted or substituted $C_1$ to $C_{12}$ fluorinated alkyl, unsubstituted or substituted $C_6$ to $C_{20}$ aryl and unsubstituted or substituted $C_5$ to $C_{20}$ heteroaryl;

wherein the substituents of B, C, D, $R^3$ and $R^4$, are independently selected from the group consisting of $C_1$-$C_{20}$ linear alkyl, $C_3$-$C_{20}$ branched alkyl, $C_3$-$C_{20}$ cyclic alkyl, $C_1$-$C_{20}$ linear alkoxy, $C_3$-$C_{20}$ branched alkoxy, linear fluorinated $C_1$-$C_{12}$ alkyl, linear fluorinated $C_1$-$C_{12}$ alkoxy, $C_3$-$C_{12}$ branched fluorinated cyclic alkyl, $C_3$-$C_{12}$ fluorinated cyclic alkyl, $C_3$-$C_{12}$ fluorinated cyclic alkoxy, CN, $C_6$-$C_{20}$ aryl, $C_2$-$C_{20}$ heteroaryl, OR, SR, (C=O)R, (C=O)NR2, $SiR_3$, (S=O)R, (S=O)$_2$R, CR=CR$_2$, Fluorine, NR$_2$, and NO$_2$;

wherein R is independently selected from $C_1$-$C_{20}$ linear alkyl, $C_1$-$C_{20}$ alkoxy, $C_1$-$C_{20}$ thioalkyl, $C_3$-$C_{20}$ branched alkyl, $C_3$-$C_{20}$ cyclic alkyl, $C_3$-$C_{20}$ branched alkoxy, $C_3$-$C_{20}$ cyclic alkoxy, $C_3$-$C_{20}$ branched thioalkyl, $C_3$-$C_{20}$ cyclic thioalkyl, $C_6$-$C_{20}$ aryl and $C_3$-$C_{20}$ heteroaryl; and $R^3$ and $R^4$ are not connected or connected with each other via a single bond.

2. The compound according to claim 1, wherein X is O.

3. The compound according to claim 1, wherein $R^1$ and $R^2$ are independently selected from the group consisting of $C_1$ to $C_{12}$ alkyl or wherein $R^1$ and $R^2$ are independently selected from the group consisting of $C_6$ to $C_{20}$ aryl.

4. The compound according to claim 1, wherein L represents a single bond or wherein L comprises at least one of a bivalent structure moiety which is selected from the group consisting of phenylene, biphenylene, dibenzofuranylene, anthracenylene, quinolinylene, terphenylenylene, dibenzosilolylene, fluorenylene and naphtylene.

5. The compound according to claim 1, wherein $R^3$ and $R^4$ are independently selected from $C_6$ to $C_{20}$ aryl.

6. The compound according to claim 1, wherein Formula (I) comprises one of a spiro[benzo[a]fluorene-11,9' fluorene], spiro[benzo[b]fluorene-11,9' fluorene], or spiro[benzo[c]fluorene-7,9'-fluorene] moiety.

7. The compound according to claim 1, represented by one of the following Chemical Formulas A-1 to A-47:

A-1
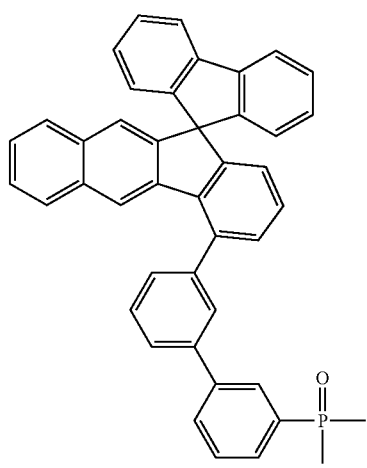
A-2
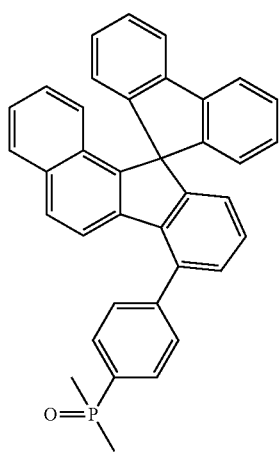
A-3
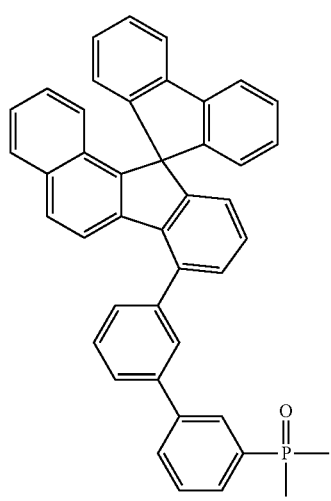
A-4
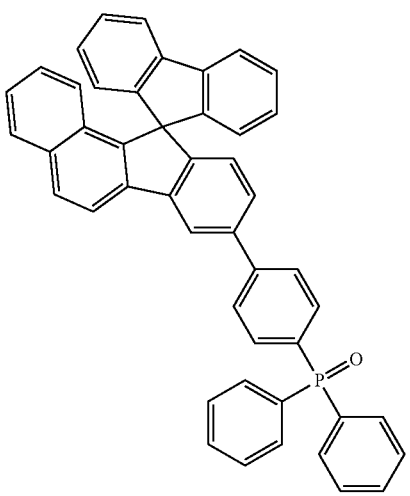
A-5
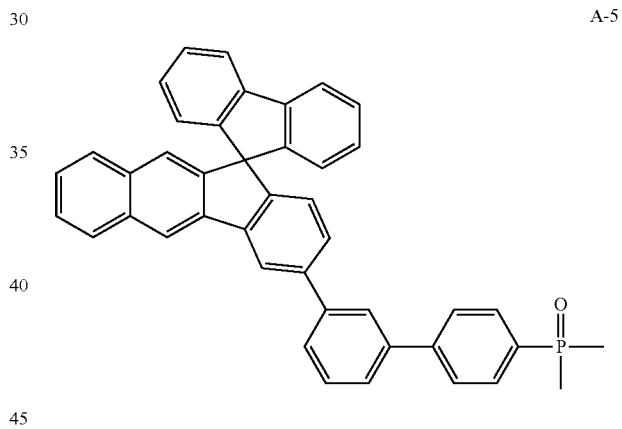
A-6
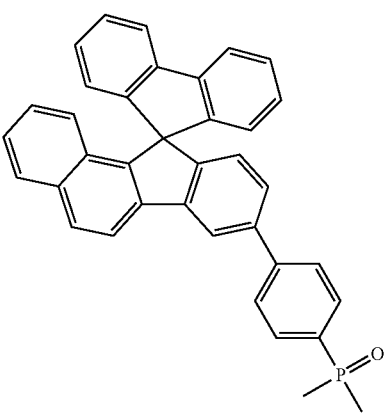

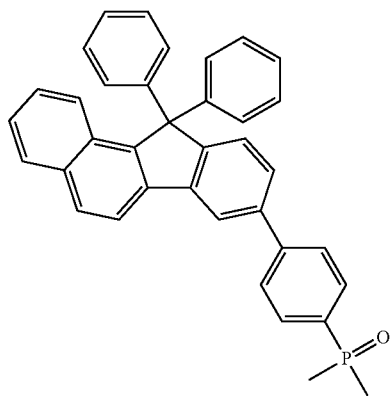
A-7
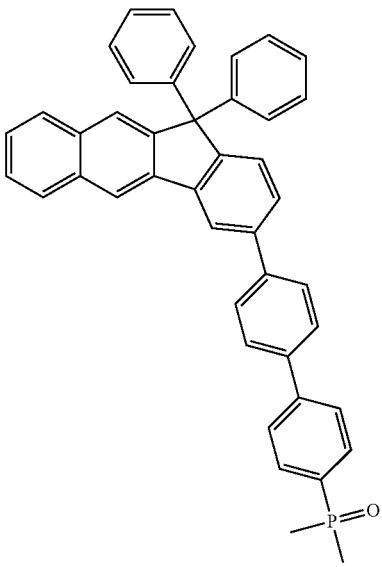
A-10
A-8
A-11
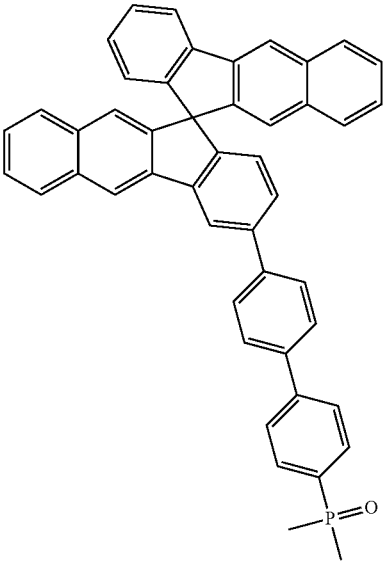
A-9
A-12
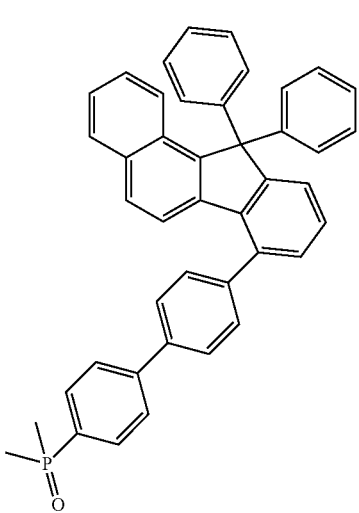

A-13
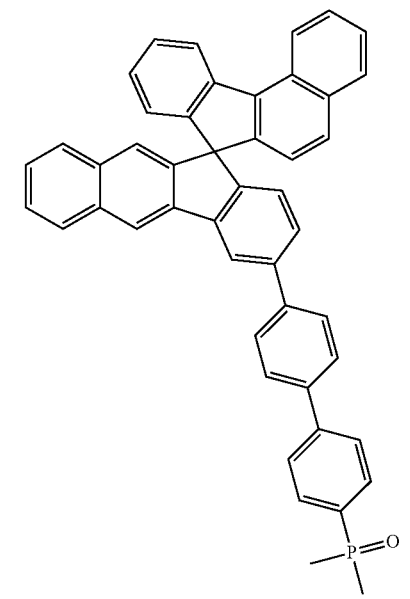
A-14
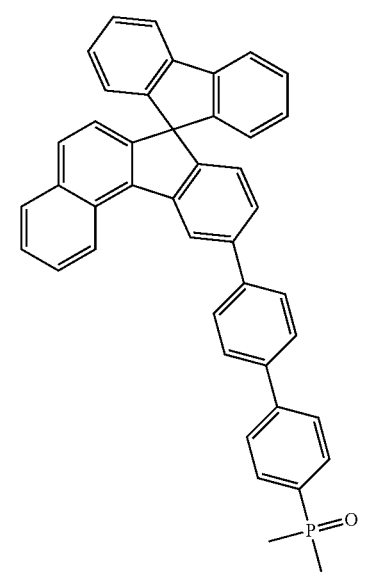
A-15
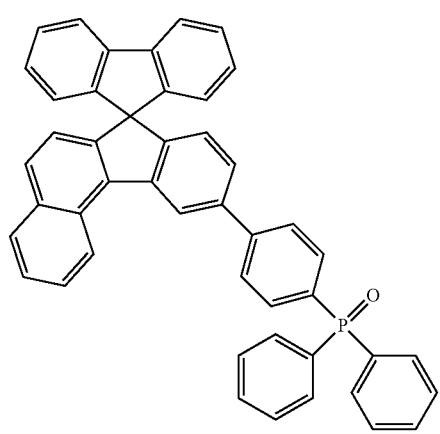
A-16
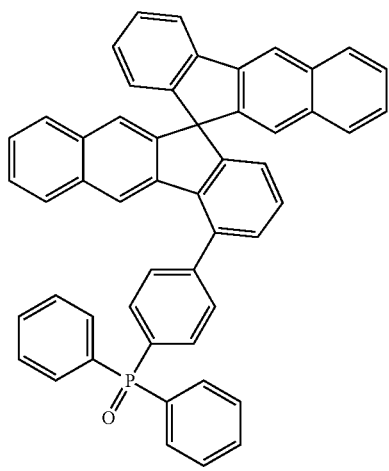
A-17
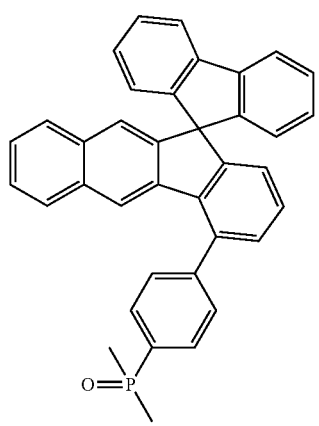
A-18

-continued
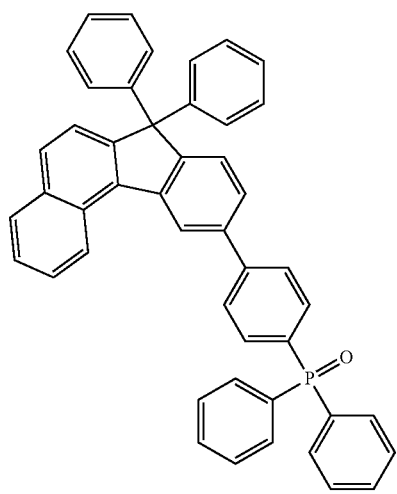
A-19
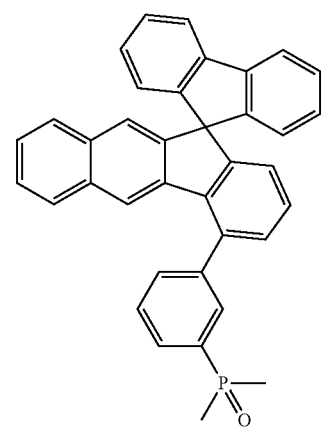
A-20
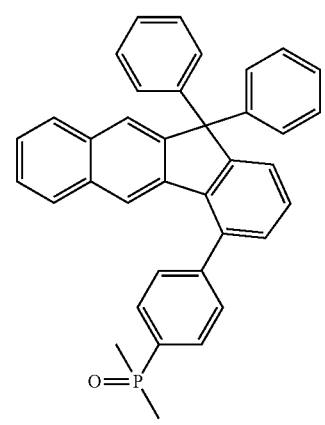
A-21
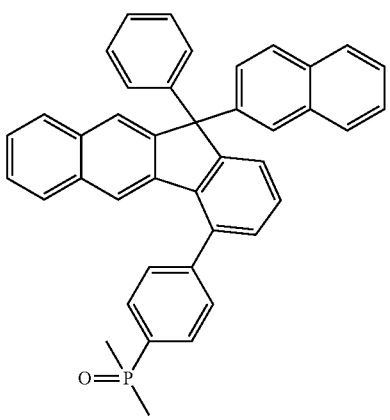
A-22
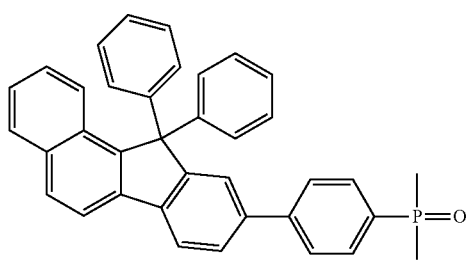
A-23
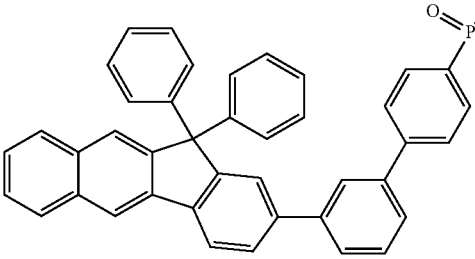
A-24
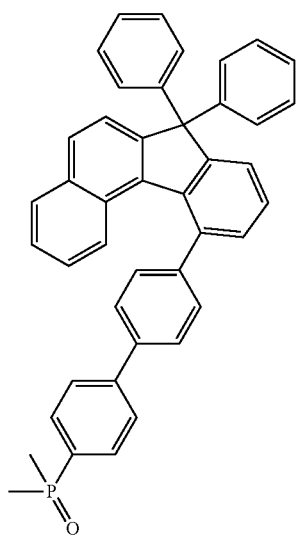
A-25

A-26 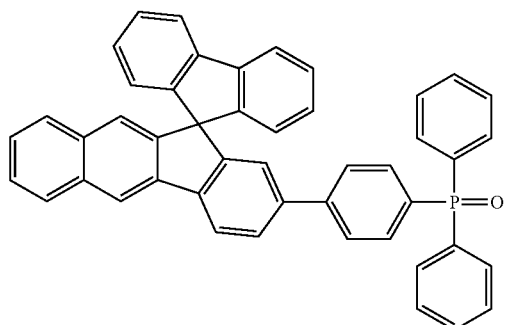
A-27 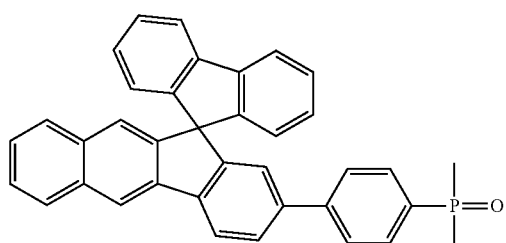
A-28 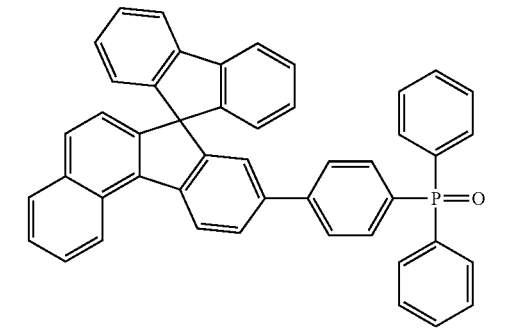
A-29 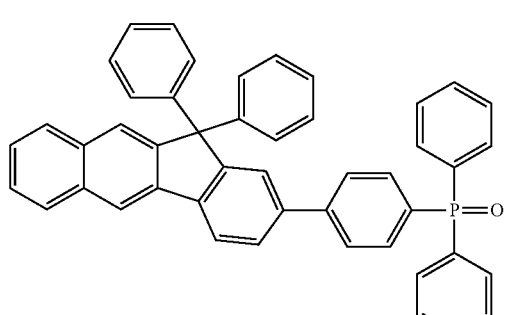
A-30 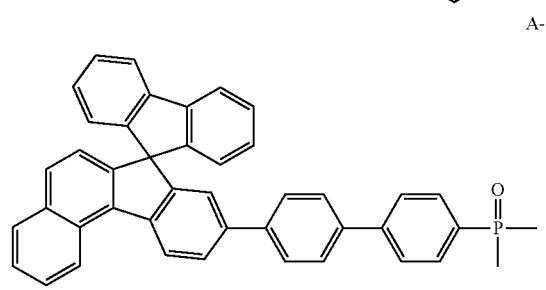
A-31 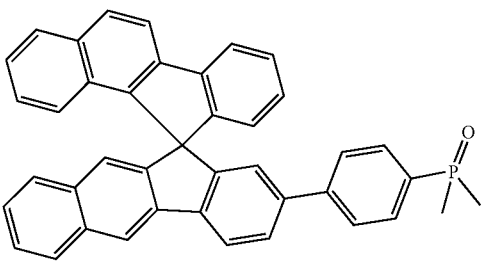
A-32 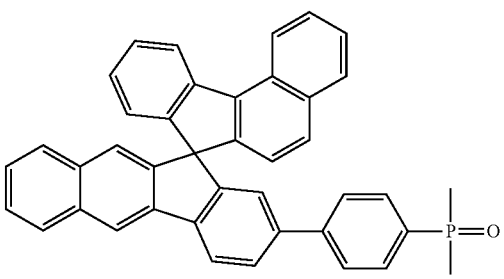
A-33 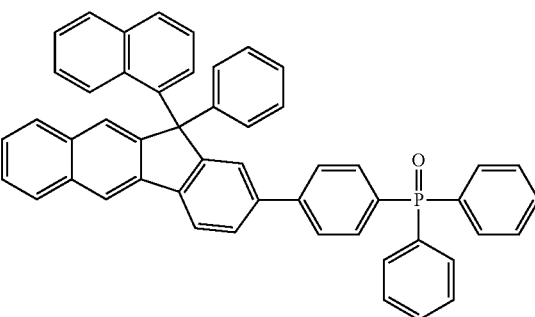
A-34 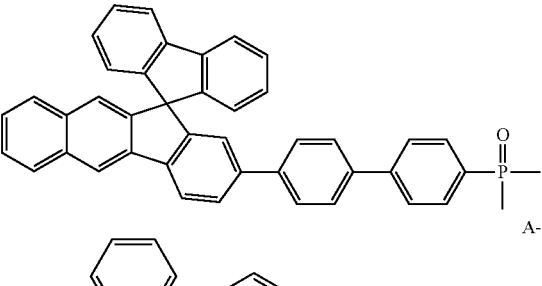
A-35 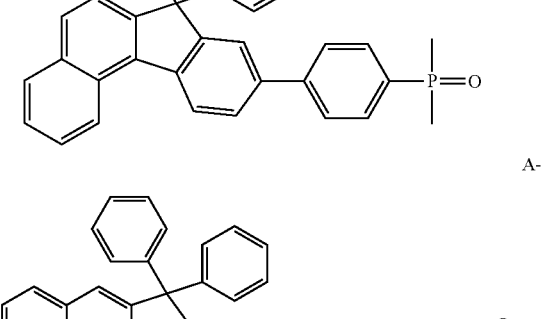
A-36 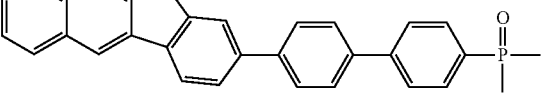

-continued
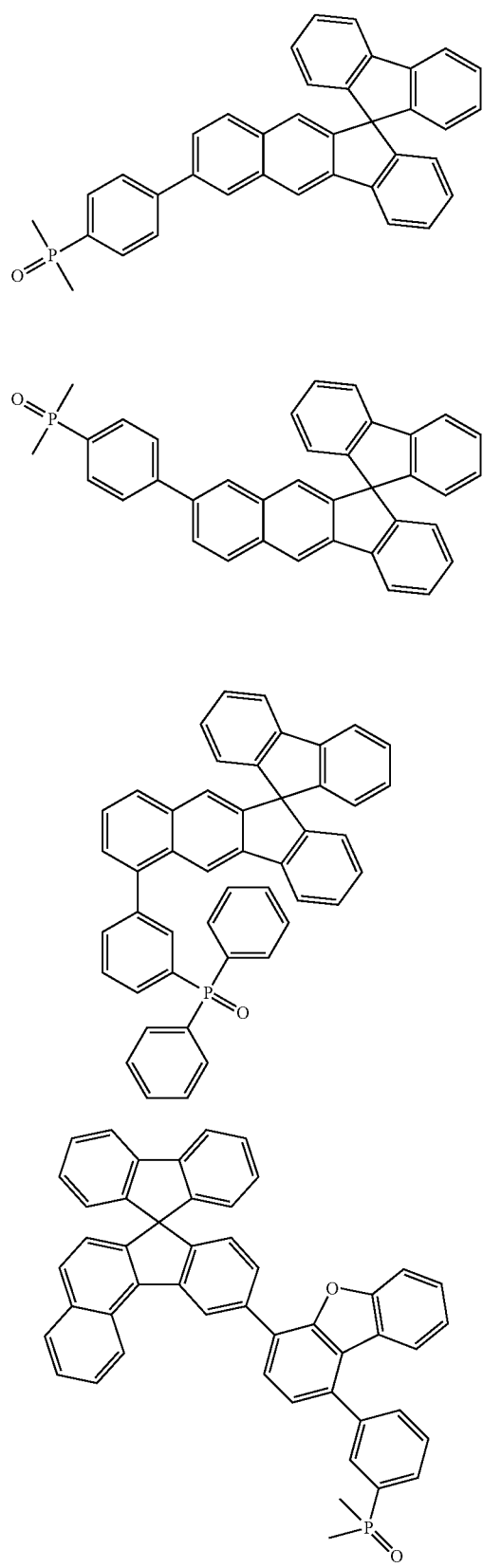
A-37
A-38
A-39
A-40
-continued
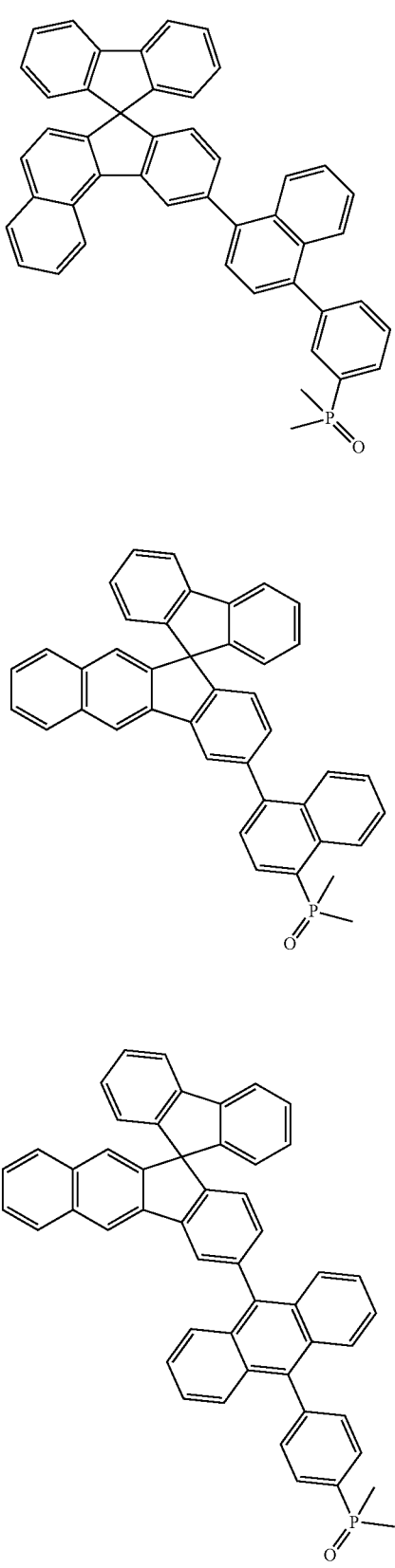
A-41
A-42
A-43

A-44

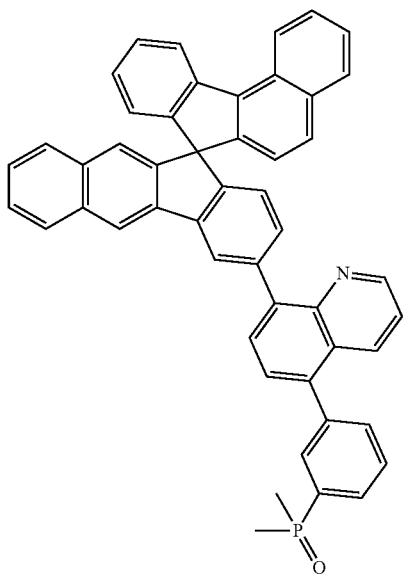

A-45

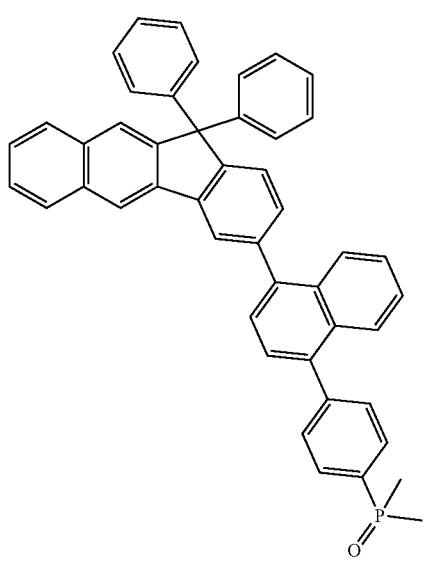

A-46

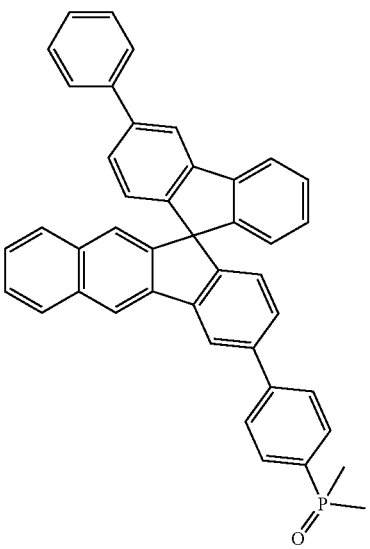

A-47

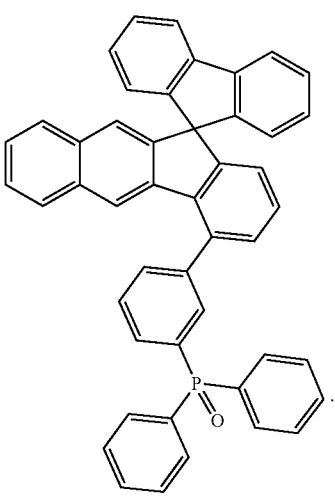

8. An organic semiconducting layer comprising a compound according to claim 1.

9. The organic semiconducting layer according to claim 8 further comprising an additive selected from a metal, a metal salt, an organic metal complex or a mixture thereof.

10. An organic electronic device comprising the organic semiconducting layer according to claim 8.

11. The organic electronic device according to claim 10, wherein the organic electronic device comprises, between an anode and a cathode and in electrical contact therewith, the organic semiconducting layer and an emission layer, wherein the organic semiconducting layer is arranged between the emission layer and the cathode.

12. The organic electronic device according to claim 11 further comprising, between the cathode and the anode, an electron transport layer, wherein the organic semiconducting layer is arranged between the electron transport layer and the cathode.

13. A display device comprising the organic electronic device according to claim 10.

14. A lighting device comprising the organic electronic device according to claim 10.

* * * * *